United States Patent
Kim et al.

(10) Patent No.: US 10,283,574 B2
(45) Date of Patent: May 7, 2019

(54) DISPLAY APPARATUS WITH BENDING AREA CAPABLE OF MINIMIZING MANUFACTURING DEFECTS

(71) Applicant: SAMSUNG DISPLAY CO., LTD., Yongin-si, Gyeonggi-do (KR)

(72) Inventors: Keonwoo Kim, Yongin-si (KR); Deukjong Kim, Yongin-si (KR); Yongjin Kim, Yongin-si (KR); Donghyun Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/332,415

(22) Filed: Oct. 24, 2016

(65) Prior Publication Data

US 2017/0278901 A1 Sep. 28, 2017

(30) Foreign Application Priority Data

Mar. 25, 2016 (KR) .................. 10-2016-0036132
Jun. 21, 2016 (KR) .................. 10-2016-0077554

(51) Int. Cl.
*G06F 3/041* (2006.01)
*H01L 27/32* (2006.01)
(Continued)

(52) U.S. Cl.
CPC .......... *H01L 27/323* (2013.01); *G06F 3/0412* (2013.01); *G06F 3/0416* (2013.01);
(Continued)

(58) Field of Classification Search
CPC ......... H01L 51/0097; H01L 2251/5338; H01L 27/3276; H01L 51/5253; H01L 27/323; H01L 27/3246; H01L 51/5256
(Continued)

(56) References Cited

U.S. PATENT DOCUMENTS 8,791,455 B2   7/2014 Kim et al.
9,287,342 B2   3/2016 Kwon et al.
(Continued)

FOREIGN PATENT DOCUMENTS

JP       2007-207962    8/2007
KR   10-2014-0045193    4/2014
(Continued)

OTHER PUBLICATIONS

EESR from the European Patent Office dated May 30, 2017 related to European Application No. 16200417.0.

*Primary Examiner* — Nduka E Ojeh
(74) *Attorney, Agent, or Firm* — F. Chau & Associates, LLC

(57) ABSTRACT

A display apparatus includes a substrate, an inorganic insulating layer, a first conductive layer, and an organic material layer. The substrate includes a first area, a second area, and a bending area located between the first area and the second area the bending area configured to be bent about a first bending axis extending in a first direction. The inorganic insulating layer is arranged over the substrate. The first conductive layer extends from the first area to the second area passing over the bending area, and is arranged over the inorganic insulating layer. The organic material layer is arranged between the inorganic insulating layer and the first conductive layer and includes a central portion overlapping the bending area and a peripheral portion extending from the central portion. An average thickness of the central portion is greater than an average thickness of the peripheral portion.

34 Claims, 14 Drawing Sheets

(51) Int. Cl.
  *H01L 51/00* (2006.01)
  *H01L 51/52* (2006.01)
  *H01L 35/24* (2006.01)
  *H01L 29/08* (2006.01)
(52) U.S. Cl.
  CPC ...... *H01L 27/3246* (2013.01); *H01L 27/3258* (2013.01); *H01L 27/3276* (2013.01); *H01L 51/0097* (2013.01); *H01L 51/5253* (2013.01); *H01L 2251/5338* (2013.01); *Y02E 10/549* (2013.01); *Y02P 70/521* (2015.11)
(58) Field of Classification Search
  USPC ......... 257/40; 438/29, 28; 349/158; 345/905
  See application file for complete search history.

(56) References Cited

U.S. PATENT DOCUMENTS

| | | | |
|---|---|---|---|
| 2014/0042406 A1 | 2/2014 | Degner et al. | |
| 2014/0140037 A1 | 5/2014 | Cho | |
| 2014/0232956 A1* | 8/2014 | Kwon | G02F 1/133305 349/12 |
| 2014/0299884 A1* | 10/2014 | Park | H01L 27/1259 257/72 |
| 2015/0123098 A1* | 5/2015 | Kang | H01L 51/5253 257/40 |
| 2015/0171113 A1* | 6/2015 | Honjo | H01L 27/1222 257/72 |
| 2015/0380679 A1* | 12/2015 | Fujiyoshi | H01L 51/5253 257/99 |
| 2016/0014883 A1 | 1/2016 | Cho et al. | |
| 2016/0066409 A1* | 3/2016 | Kwon | H05K 1/028 174/254 |
| 2016/0085352 A1 | 3/2016 | Kang | |
| 2017/0179432 A1* | 6/2017 | Visweswaran | H01L 51/5256 |
| 2017/0250237 A1* | 8/2017 | Cheng | H01L 51/0097 |

FOREIGN PATENT DOCUMENTS

| | | |
|---|---|---|
| KR | 10-2014-0063227 | 5/2014 |
| KR | 10-2014-0108914 | 9/2014 |
| KR | 1020140129647 | 11/2014 |
| KR | 10-2015-0027956 | 3/2015 |
| KR | 10-2015-0074806 | 7/2015 |

* cited by examiner

DISPLAY APPARATUS WITH BENDING AREA CAPABLE OF MINIMIZING MANUFACTURING DEFECTS

CROSS-REFERENCE TO RELATED APPLICATIONS

This application claims the benefit of Korean Patent Application No. 10-2016-0036132, filed on Mar. 25, 2016 in the Korean Intellectual Property Office, and Korean Patent Application No. 10-2016-0077554, filed on Jun. 21, 2016 in the Korean Intellectual Property Office, the disclosures of which are incorporated by reference herein in their entirety.

TECHNICAL FIELD

Exemplary embodiments of the inventive concept relate to a display apparatus, and more particularly, to a display apparatus capable of minimizing the occurrence of defects, such as disconnections, that may occur during manufacturing processes, while ensuring a longer lifespan of the display apparatus.

DISCUSSION OF RELATED ART

A display apparatus, which visually displays data, includes a substrate divided into a display area and a non-display area. In the display area, gate lines and data lines are insulated from each other and a plurality of pixel areas are defined by crossing the gate lines and the data lines. Also, in the display area, thin film transistors (TFTs) and pixel electrodes electrically connected to the TFTs are provided to the pixel areas. In the non-display area, various conductive layers, such as wirings transmitting electrical signals to the display area, are provided.

At least a portion of the display apparatus may be bent to enhance visibility at various angles or decrease the size of the non-display area. Various techniques are being developed for reducing defects and reducing costs during the manufacturing of these bent display apparatuses.

SUMMARY

According to an exemplary embodiment of the inventive concept, a display apparatus includes: a substrate including a first area, a second area, and a bending area located between the first area and the second area, the bending area configured to be bent about a first bending axis extending in a first direction; an inorganic insulating layer arranged over the substrate; a first conductive layer extending from the first area to the second area passing over the bending area, and arranged over the inorganic insulating layer; and an organic material layer arranged between the inorganic insulating layer and the first conductive layer, and including a central portion and a peripheral portion. The central portion overlaps with the bending area. The peripheral portion extends from the central portion. An average thickness of the central portion is greater than an average thickness of the peripheral portion.

According to an exemplary embodiment of the inventive concept, the inorganic insulating layer may have a flat upper surface at an area overlapping with the organic material layer.

According to an exemplary embodiment of the inventive concept, the central portion may have a substantially uniform thickness.

According to an exemplary embodiment of the inventive concept, the peripheral portion may include an area having a substantially uniform thickness, and a thickness of the peripheral portion may decrease in a direction away from the central portion.

According to an exemplary embodiment of the inventive concept, a thickness of the peripheral portion may gradually decrease in a direction away from the central portion.

According to an exemplary embodiment of the inventive concept, the organic material layer may include a first organic material layer, and a second organic material layer arranged on the first organic material layer. The first organic material has a first width. The second organic material layer has a second width smaller than the first width. The second width may be greater than a width of the bending area.

According to an exemplary embodiment of the inventive concept, the organic material layer may have an uneven surface at least partially in an upper surface of the organic material layer.

According to an exemplary embodiment of the inventive concept, the organic material layer may have the uneven surface in the central portion.

According to an exemplary embodiment of the inventive concept, an upper surface of the first conductive layer over the organic material layer may have a shape corresponding to a shape of the upper surface of the organic material layer.

According to an exemplary embodiment of the inventive concept, the inorganic insulating layer may have a groove in an area overlapping with the organic material layer.

According to an exemplary embodiment of the inventive concept, an area of the groove may be larger than an area of the bending area.

According to an exemplary embodiment of the inventive concept, the organic material layer may cover an inner surface of the groove.

According to an exemplary embodiment of the inventive concept, a height of the organic material layer from an upper surface of the substrate may be greater than a height of the inorganic insulating layer from the upper surface of the substrate.

According to an exemplary embodiment of the inventive concept, a height of the peripheral portion from an upper surface of the substrate may gradually decrease in a direction away from the central portion.

According to an exemplary embodiment of the inventive concept, a height of the organic material layer from an upper surface of the substrate may be less than a height of the inorganic insulating layer from the upper surface of the substrate.

According to an exemplary embodiment of the inventive concept, an area of the uneven surface may be larger than an area of the central portion.

According to an exemplary embodiment of the inventive concept, the display apparatus may further include a protective film disposed on a lower surface of the substrate. The lower surface may be opposite a surface of the substrate nearest to the inorganic insulating layer. The protective film includes an opening corresponding to the bending area.

According to an exemplary embodiment of the inventive concept, an area of the opening may be larger than an area of the bending area.

According to an exemplary embodiment of the inventive concept, the display apparatus may further include: an encapsulation layer covering a display device over the first area; and a touch electrode configured to provide a touchscreen and located over the encapsulation layer. The first conductive layer may include substantially the same material as that of the touch electrode.

According to an exemplary embodiment of the inventive concept, the display apparatus may further include a touch protective layer covering the touch electrode and the first conductive layer.

According to an exemplary embodiment of the inventive concept, the display apparatus may further include: a thin film transistor (TFT) arranged over the first area or the second area and including a source electrode, a drain electrode, and a gate electrode; and a planarization layer covering the TFT and including an organic material. The organic material layer may include substantially the same material as that of the planarization layer.

According to an exemplary embodiment of the inventive concept, the display apparatus may further include: an organic light-emitting device arranged over the first area and including a pixel electrode, an opposite electrode facing the pixel electrode, and an intermediate layer including an organic emission layer and arranged between the pixel electrode and the opposite electrode; and a pixel defining layer arranged over the first area, the pixel defining layer having an opening that exposes a center portion of the pixel electrode and defines a pixel area. The organic material layer may include substantially the same material as that of the pixel defining layer.

According to an exemplary embodiment of the inventive concept, the display apparatus may further include an encapsulation layer including a first inorganic encapsulation layer, a second inorganic encapsulation layer, and an organic encapsulation layer between the first inorganic encapsulation layer and the second inorganic encapsulation layer and covering a display device over the first area. The organic material layer may include substantially the same material as that of the organic encapsulation layer.

According to an exemplary embodiment of the inventive concept, the display apparatus may further include a second conductive layer arranged over the first area or the second area. The second conductive layer is located on a layer different from a layer on which the first conductive layer is located. The second conductive layer is electrically connected to the first conductive layer.

According to an exemplary embodiment of the inventive concept, an elongation rate of the first conductive layer may be greater than that of the second conductive layer.

According to an exemplary embodiment of the inventive concept, the display apparatus may further include a TFT arranged over the first area or the second area and including a source electrode, a drain electrode, and a gate electrode. The first conductive layer may be on a same layer as the source electrode and the drain electrode. The second conductive layer may be on a same layer as the gate electrode.

According to an exemplary embodiment of the inventive concept, the display apparatus may further include a stress neutralization layer arranged over an upper portion of the first conductive layer.

According to an exemplary embodiment of the inventive concept, a display apparatus includes a substrate, an inorganic insulating layer, a first conductive layer, and an organic material layer. The substrate is divided into a first area, a second area, and a bending area located between the first area and the second area. The bending area is configured to be bent about a first bending axis extending in a first direction. The inorganic insulating layer is arranged over the substrate. The first conductive layer extends from the first area to the second area passing over the bending area, and is arranged over the inorganic insulating layer. The organic material layer is arranged between the inorganic insulating layer and the first conductive layer, and includes a central portion and a peripheral portion. The central portion overlaps with the bending area. The peripheral portion extends from the central portion. An average thickness of the central portion is greater than an average thickness of the peripheral portion. The substrate has a multi-layer structure extending through the first area, the second area, and the bending area. The substrate includes a first resin layer, a barrier layer, an intermediate layer, and a second resin layer. The first resin layer includes a polymer resin. The barrier layer includes an inorganic material and is disposed over the first resin layer. The intermediate layer includes an amorphous material and is disposed over the barrier layer. The second resin layer includes a polymer resin and is disposed over the intermediate layer.

According to an exemplary embodiment of the inventive concept, the first conductive layer may extend from the first area to the second area in a second direction perpendicular to the first direction, and the first conductive layer may form a wavy pattern while extending in the second direction.

According to an exemplary embodiment of the inventive concept, the display apparatus further includes a protective film disposed on a lower surface of the substrate. The lower surface is opposite a surface of the substrate nearest to the inorganic insulating layer. The protective film includes an opening corresponding to the bending area. An area of the opening is larger than an area of the bending area and smaller than an area of the organic material layer.

According to an exemplary embodiment of the inventive concept, the organic material layer has an uneven surface at least partially in an upper surface of the organic material layer, and an upper surface of the first conductive layer over the organic material layer has an uneven surface with a shape that is independent of a shape of the uneven surface of the organic material layer.

According to an exemplary embodiment of the inventive concept, an upper surface of the inorganic insulating layer and an upper surface of the peripheral portion of the organic material layer contact, forming an angle that is less than or equal to 45 degrees.

BRIEF DESCRIPTION OF THE DRAWINGS

The above and other features of the inventive concept will become apparent and more clearly understood by describing in detail exemplary embodiments thereof with reference to the accompanying drawings.

DETAILED DESCRIPTION OF THE EMBODIMENTS

Figure 1:
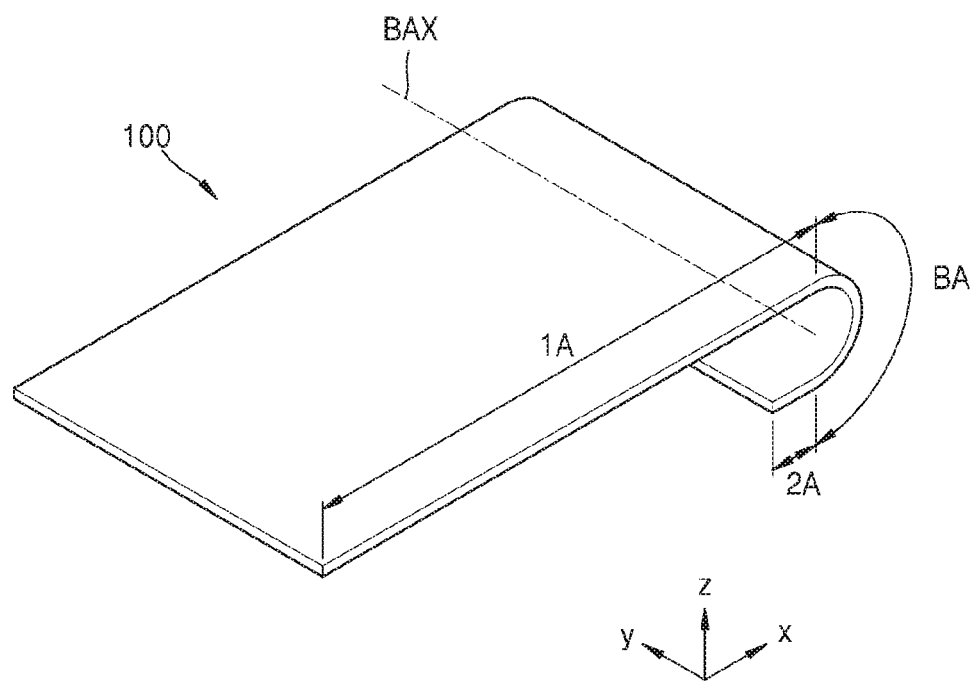
FIG. 1 is a schematic perspective view partially showing a display apparatus according to an exemplary embodiment of the inventive concept.

Exemplary embodiments of the inventive concept will be described more fully hereinafter with reference to the accompanying drawings. Like reference numerals may refer to like elements throughout the accompanying drawings.

As used herein, the term "and/or" includes any and all combinations of one or more of the associated listed items.

Sizes and thicknesses of components in the drawings may be exaggerated for convenience of explanation. In other words, the inventive concept is not limited thereto.

In the examples described below, the x-axis, the y-axis, and the z-axis are not limited to the three axes of the rectangular coordinate system and may be interpreted in a broader sense. For example, the x-axis, the y-axis, and the z-axis may be perpendicular to one another or may represent different directions that are not perpendicular to one another.

Exemplary embodiments of the inventive concept may be implemented differently in that the process order may be different from the described order. For example, two consecutively described processes may be performed substantially at the same time or performed in an order opposite to the described order.

A display apparatus is an apparatus displaying images, for example, a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, a cathode ray display apparatus, or the like.

Exemplary embodiments of the inventive concept provide for a display apparatus capable of guaranteeing a longer lifespan thereof and minimizing the occurrence of defects, such as disconnections, during manufacturing processes.

Hereinafter, an organic light-emitting display apparatus will be described as an example of the display apparatus according to exemplary embodiments of the inventive concept. However, the display apparatus according to the present inventive concept is not limited thereto and may include various types of display apparatuses.

Figure 2:
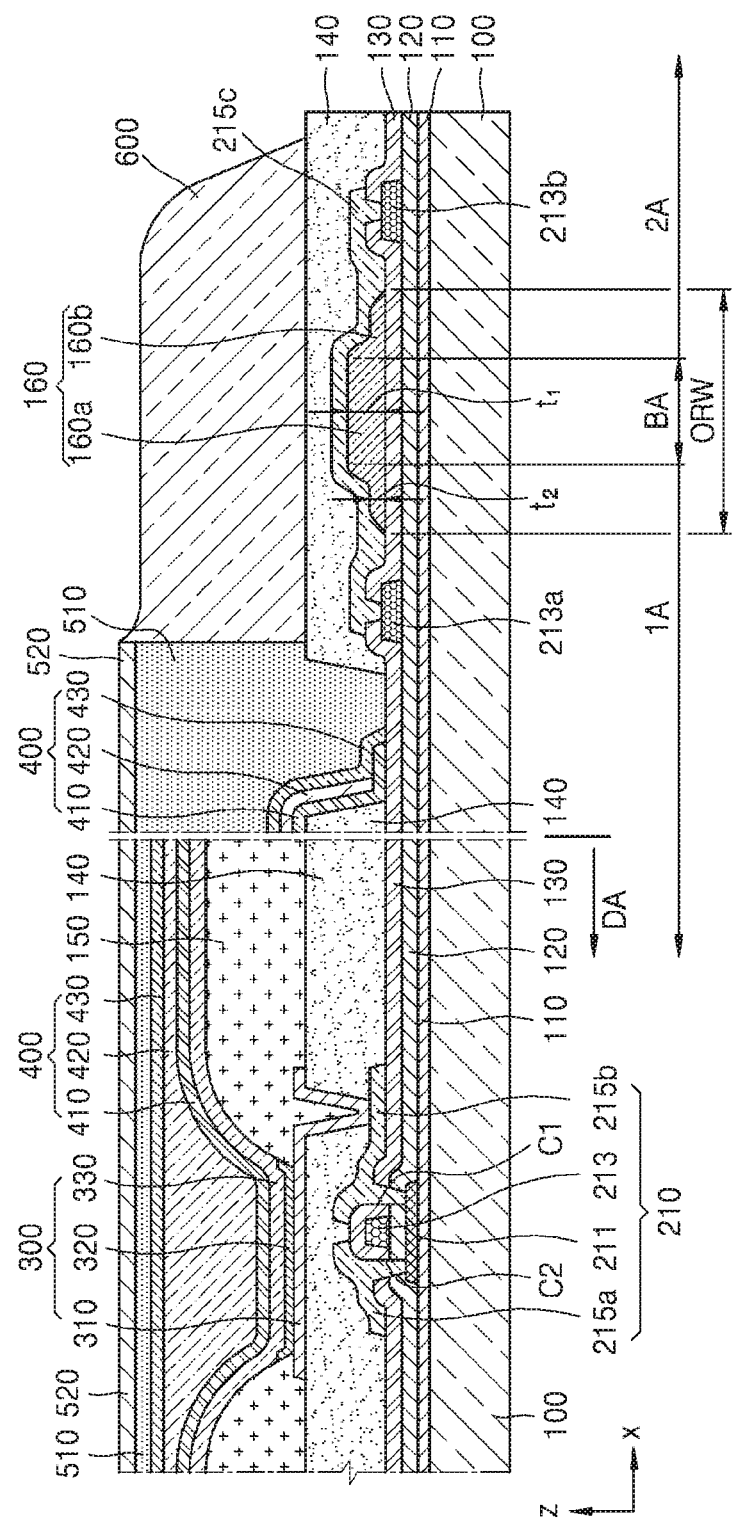
FIG. 2 is a schematic cross-sectional view partially showing the display apparatus of FIG. 1 according to an exemplary embodiment of the inventive concept.

FIG. 1 is a schematic perspective view partially showing a display apparatus according to an exemplary embodiment of the inventive concept, and FIG. 2 is a schematic cross-sectional view partially showing the display apparatus of FIG. 1 according to an exemplary embodiment of the inventive concept. In the display apparatus according to the present exemplary embodiment, a substrate 100 that is a part of the display apparatus is partially bent as shown in FIG. 1, and thus, the display apparatus is also partially bent because the substrate 100 is bent. However, FIG. 2 shows the display apparatus that is not bent, for convenience of description. Other cross-sectional views and plan views according to exemplary embodiments of the inventive concept, which will be described below, also show display apparatuses that are not bent, for convenience of description.

As shown in FIGS. 1 and 2, the substrate 100 includes a bending area BA extending in a first direction (+y direction). The bending area BA is located between a first area 1A and a second area 2A, in a second direction (+x direction) that crosses the first direction. In addition, as shown in FIG. 1, the substrate 100 is bent about a bending axis BAX extending in the first direction (+y direction). The substrate 100 may include various materials having flexible or bendable characteristics, for example, a polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The substrate 100 may have a single-layer or multi-layer structure including the above-described material, and the multi-layer structure may further include an inorganic layer.

The first area 1A includes a display area DA. As shown in FIG. 2, the first area 1A may also include a portion of a non-display area outside the display area DA. The second area 2A also includes the non-display area.

A plurality of pixels that display images may be provided in the display area DA of the substrate 100. The display area DA may include devices such as a display device 300, a thin film transistor (TFT) 210, and a capacitor (Cst). The display area DA may further include signal wirings such as a gate line through which gate signals are transmitted, a data line through which data signals are transmitted, a driving power line through which power is transmitted, and a common power line. A pixel may be formed by an electric coupling of the TFT 210, the capacitor, the display device 300, and the like connected to the gate line, the data line, and the driving power line, and the pixel may display an image. The pixel may emit light at a brightness corresponding to driving current passing through the display device 300 in response to the data signals supplied to the pixel. The data signals may be generated according to driving power and common power. The plurality of pixels may be arranged in various ways, such as a stripe layout, a PenTile layout, or the like.

In FIG. 2, the display device 300 in the display area DA may be an organic light-emitting device. The organic light-emitting device may be electrically connected to the TFT 210 via a pixel electrode 310. If necessary, a separate TFT may be arranged on a peripheral area outside the display area DA as well. The TFT located on the peripheral area may be, for example, a part of a circuit unit for controlling electric signals applied to the display area DA.

The TFT 210 may include a semiconductor layer 211, a gate electrode 213, a source electrode 215a, and a drain electrode 215b. The semiconductor layer 211 may include amorphous silicon, polycrystalline silicon, an oxide semiconductor, or an organic semiconductor material.

The gate electrode 213 may be connected to a gate wiring through which on and off signals are applied to the TFT 210. The gate electrode 213 may include a low-resistive metallic material. For example, the gate electrode 213 may have at least one layer including a conductive material, e.g., molybdenum (Mo), aluminum (Al), copper (Cu), and/or titanium (Ti).

Each of the source electrode 215a and the drain electrode 215b may have a single layer or multiple layers including a high conductivity material. The source electrode 215a and the drain electrode 215b may be connected to a source area and a drain area, respectively, of the semiconductor layer 211. For example, each of the source electrode 215a and the drain electrode 215b may have at least one layer including a conductive material, e.g., Al, Cu, and/or Ti.

The source electrode 215a and the drain electrode 215b may be connected to the semiconductor layer 211 via contact holes C1 and C2. The contact holes C1 and C2 may be formed by simultaneously etching an interlayer insulating layer 130 and a gate insulating layer 120.

According to an exemplary embodiment of the inventive concept, the TFT 210 is a top gate type TFT in which the gate electrode 213 is above the semiconductor layer 211. However, the inventive concept is not limited thereto. For example, the TFT 210 may be a bottom gate type TFT in which the gate electrode 213 is under the semiconductor layer 211.

In order to ensure an insulating property between the semiconductor layer 211 and the gate electrode 213, the gate insulating layer 120, which includes an inorganic material such as silicon oxide, silicon nitride, and/or silicon oxynitride, may be arranged between the semiconductor layer 211 and the gate electrode 213. In addition, the interlayer insulating layer 130, which includes an inorganic material such as silicon oxide, silicon nitride, and/or silicon oxynitride, may be arranged on the gate electrode 213, and the source electrode 215a and the drain electrode 215b may be arranged on the interlayer insulating layer 130. The insulating layers that include inorganic material, as described above, may be formed by chemical vapor deposition (CVD) or atomic layer deposition (ALD). A similar process may be performed with respect to exemplary embodiments described below.

A buffer layer 110, including an inorganic material such as silicon oxide, silicon nitride, and/or silicon oxynitride, may be arranged between the TFT 210 and the substrate 100. The buffer layer 110 may increase smoothness of an upper surface of the substrate 100, or may prevent or reduce infiltration of impurities into the semiconductor layer 211 from the substrate 100, etc. The buffer layer 110 may include an inorganic material such as oxide or nitride, an organic material, or an organic/inorganic composite material, and may have a single-layer or multi-layer structure including the inorganic material and/or the organic material. According to exemplary embodiments of the inventive concept, the buffer layer 110 may have a triple-layer structure of silicon oxide/silicon nitride/silicon oxide.

In addition, a planarization layer 140 may be arranged on the TFT 210. For example, when an organic light-emitting device is arranged on the TFT 210 as shown in FIG. 2, the planarization layer 140 may planarize an upper portion of a protective layer that covers the TFT 210. The planarization layer 140 may include an organic material, for example, benzocyclobutene (BCB) or hexamethyldisiloxane (HMDSO). Although the planarization layer 140 of FIG. 2 has a single-layer structure, the planarization layer 140 may have various modifications such as a multi-layer structure. In addition, as shown in FIG. 2, the planarization layer 140 may have an opening outside the display area DA so that a portion of the planarization layer 140 in the display area DA and a portion of the planarization layer 140 in the second area 2A may be physically separate. Thus, impurities from the outside may not infiltrate into the display area DA via the planarization layer 140.

In the display area DA of the substrate 100, an organic light-emitting device (e.g., the display device 300) may be disposed on the planarization layer 140. The organic light-emitting device may include the pixel electrode 310, an opposite electrode 330, and an intermediate layer 320 that includes an organic emission layer and is arranged between the pixel electrode 310 and the opposite electrode 330. The pixel electrode 310 is electrically connected to the TFT 210 by contacting one of the source electrode 215a and the drain electrode 215b via an opening formed in the planarization layer 140, as shown in FIG. 2.

A pixel defining layer 150 may be arranged on the planarization layer 140. The pixel defining layer 150 has an opening corresponding to each of a plurality of sub-pixels, e.g., an opening exposing at least a center portion of the pixel electrode 310, thus defining each pixel. Also, in FIG. 2, the pixel defining layer 150 increases a distance between an edge of the pixel electrode 310 and the opposite electrode 330 above the pixel electrode 310 to prevent an arc from generating at the edge of the pixel electrode 310. The pixel defining layer 150 may include, for example, an organic material such as PI or HMDSO.

The intermediate layer 320 of the organic light-emitting device may include a low-molecular weight material or a polymer material. When the intermediate layer 320 includes the low-molecular weight material, the intermediate layer 320 may have a single or multi-layer structure including a hole injection layer (HIL), a hole transport layer (HTL), an emission layer (EML), an electron transport layer (ETL), and an electron injection layer (EIL), and may include various organic materials such as copper phthalocyanine (CuPc), N,N'-Di(naphthalene-1-yl)-N,N'-diphenyl-benzidine (NPB), or tris-8-hydroxyquinoline aluminum (Alq$_3$). These layers may be formed by a vacuum deposition method.

When the intermediate layer 320 includes the polymer material, the intermediate layer 320 may have a structure mostly including an HTL and an EML. In this regard, the HTL may include PEDOT, and the EML may include polymer materials such as a poly-phenylenevinylene (PPV)-based material and a polyfluorene-based material. The intermediate layer 320 may be formed by a screen printing method, an inkjet printing method, a laser induced thermal imaging (LITI) method, or the like.

The intermediate layer 320 is not limited to the above examples, and may have various other structures. In addition, the intermediate layer 320 may include a layer that is integrally formed throughout a plurality of pixel electrodes 310, or a layer that is patterned to correspond to each of the plurality of pixel electrodes 310.

The opposite electrode 330 is arranged over the display area DA, and as shown in FIG. 2, the opposite electrode 330 may cover the display area DA. In other words, the opposite electrode 330 may be integrally formed with respect to a plurality of organic light-emitting devices and thus may correspond to the plurality of pixel electrodes 310.

Since the organic light-emitting device may be easily damaged due to factors such as external moisture or oxygen, an encapsulation layer 400 may cover and protect the organic light-emitting device. The encapsulation layer 400 may cover the display area DA and extend to the outside of the display area DA. As shown in FIG. 2, the encapsulation layer 400 may include a first inorganic encapsulation layer 410, an organic encapsulation layer 420, and a second inorganic encapsulation layer 430.

The first inorganic encapsulation layer 410 may cover the opposite electrode 330, and may include silicon oxide, silicon nitride, and/or silicon oxynitride. If necessary, other layers such as a capping layer may be arranged between the first inorganic encapsulation layer 410 and the opposite electrode 330. Since the first inorganic encapsulation layer 410 is formed along the opposite electrode 330, which is uneven, an upper surface of the first inorganic encapsulation layer 410 is also uneven, as shown in FIG. 2. The organic encapsulation layer 420 may cover the first inorganic encapsulation layer 410, and unlike the first inorganic encapsulation layer 410, an upper surface of the organic encapsulation layer 420 may be roughly flat. In more detail, the organic encapsulation layer 420 may have a roughly flat upper surface at a portion corresponding to the display area DA. The organic encapsulation layer 420 may include at least one material selected from the group consisting of PET, PEN, PC, PI, polyethylene sulfonate, polyoxymethylene, PAR, and HMDSO. The second inorganic encapsulation layer 430 may cover the organic encapsulation layer 420 and may include silicon oxide, silicon nitride, and/or silicon oxynitride. Outside the display area DA, an edge of the second inorganic encapsulation layer 430 may contact the first inorganic encapsulation layer 410 so that the organic encapsulation layer 420 is not externally exposed.

As described above, since the encapsulation layer 400 includes the first inorganic encapsulation layer 410, the organic encapsulation layer 420, and the second inorganic encapsulation layer 430, even when there is a crack in the encapsulation layer 400, the crack may not extend between the first inorganic encapsulation layer 410 and the organic encapsulation layer 420 or between the organic encapsulation layer 420 and the second inorganic encapsulation layer 430, due to the above-described multi-layered structure. Thus, formation of a path, through which external moisture or oxygen may infiltrate into the display area DA, may be prevented or reduced.

A polarization plate 520 may be attached to the encapsulation layer 400 by an optically clear adhesive (OCA) 510. The polarization plate 520 may reduce reflection of external light. For example, when external light passes through the polarization plate 520, it is reflected by an upper surface of the opposite electrode 330 and then passes through the polarization plate 520 again. As such, a phase of the external light may be changed as the external light passes through the polarization plate 520 twice. As a result, a phase of reflected light is different from the phase of the external light so that destructive interference occurs, and accordingly, reflection of external light may be reduced and visibility may be improved. The OCA 510 and the polarization plate 520 may cover the opening in the planarization layer 140, as shown in FIG. 2. According to an exemplary embodiment of the inventive concept, the display apparatus does not necessarily include the polarization plate 520, and the polarization plate 520 may be omitted or replaced with another configuration. For example, the polarization plate 520 may be omitted, and instead, a black matrix and a color filter may be used to reduce the reflection of external light.

The buffer layer 110, the gate insulating layer 120, and the interlayer insulating layer 130, all of which include an inorganic material, may be referred to as an inorganic insulating layer. In FIG. 2, the inorganic insulating layer has a flat upper surface at an area overlapping with an organic material layer 160, which will be described below.

The display apparatus may include a first conductive layer 215c arranged over the inorganic insulating layer, and the first conductive layer 215c extends from the first area 1A toward the second area 2A through the bending area BA. The first conductive layer 215c may serve as a wiring via which electrical signals are transmitted to the display area DA. The first conductive layer 215c may be formed simultaneously with the source electrode 215a or the drain electrode 215b and use the same material as that of the source electrode 215a or the drain electrode 215b.

In addition, the display apparatus may include the organic material layer 160, which is arranged between the inorganic insulating material and the first conductive layer 215c and includes a central portion 160a overlapping the bending area BA and a peripheral portion 160b extending from the central portion 160a. In other words, the peripheral portion 160b refers to an area that does not overlap with the bending area BA. Also, an average thickness <t1> of the central portion 160a of the organic material layer 160 is greater than an average thickness <t2> of the peripheral portion 160b. In this regard, the average thickness <t1> of the central portion 160a may refer to a value obtained by averaging thicknesses t1 of different sections of the central portion 160a, and the average thickness <t2> of the peripheral portion 160b may refer to a value obtained by averaging thicknesses t2 of different sections of the peripheral portion 160b.

The organic material layer 160 may overlap with the bending area BA and may extend to a portion of the non-bending area. In other words, the organic material layer 160 having a predetermined width ORW may be formed on the inorganic insulating layer. In this regard, the predetermined width ORW of the organic material layer 160 is illustrated in FIG. 2 as being defined by a distance between boundaries at which an upper surface of the organic material layer 160 meets an upper surface of the inorganic insulating layer. Referring to FIG. 2, the width ORW of the organic material layer 160 is greater than a width of the bending area BA.

As described above, although FIG. 2 shows that the display apparatus is not bent for convenience of description, the display apparatus according to the present exemplary embodiment is actually in a state in which the substrate 100 is bent at the bending area BA, as shown in FIG. 1. To achieve this, during manufacturing processes, the display apparatus is manufactured in a state in which the substrate 100 is roughly flat, as shown in FIG. 2, and then, the substrate 100 is bent at the bending area BA so that the display apparatus may roughly have the shape as shown in FIG. 1. In this regard, although a tensile stress may be applied to the first conductive layer 215c while the substrate 100 is bent at the bending area BA, the display apparatus may prevent or reduce the occurrence of defects in the first conductive layer 215c during the bending process.

If the organic material layer 160 is not between the first conductive layer 215c and the inorganic insulating layer and thus the first conductive layer 215c is arranged on the inorganic insulating layer in the bending area BA, a large tensile stress is applied to the first conductive layer 215c when the substrate 100 is bent. The inorganic insulating layer has a higher hardness than that of the organic material layer, and accordingly, cracks are more likely to occur in the inorganic insulating layer at the bending area BA. When cracks occur in the inorganic insulating layer, the first conductive layer 215c disposed on the inorganic insulating layer may also have cracks, and thus, there is a high possibility of defects occurring, such as a disconnection in the first conductive layer 215c.

However, in the display apparatus according to the present exemplary embodiment, the organic material layer 160 is arranged between the first conductive layer 215c and the inorganic insulating layer in the bending area BA. The organic material layer 160 may buffer or absorb a tensile stress that the substrate 100 and the inorganic insulating layer are subjected to because of bending, and may reduce the tensile stress transferred to the first conductive layer 215c. Accordingly, the occurrence of cracks in a portion of the first conductive layer 215c that corresponds to the bending area BA may be prevented or reduced.

As illustrated in FIG. 2, the average thickness <t1> of the central portion 160a of the organic material layer 160 is greater than the average thickness <t2> of the peripheral portion 160b of the organic material layer 160. The organic material layer 160 may have the predetermined width ORW, and the predetermined width ORW of the organic material layer 160 may be greater than the width of the bending area BA. The organic material layer 160 may have a shape with banks or slopes having a gentle inclination (e.g., a bank shape).

According to exemplary embodiments of the inventive concept, the central portion 160a of the organic material layer 160 may have a substantially uniform thickness t1. The thickness t1 of the central portion 160a may be set by taking into account the tensile stress that is applied to the substrate 100 and the inorganic insulating layer due to bending.

A thickness t2 of the peripheral portion 160b decreases in a direction away from the central portion 160a (e.g., forming banks), and thus, an upper surface of the peripheral portion 160b may have a gentle inclination with respect to the upper surface of the inorganic insulating layer. For example, FIG. 2 illustrates that at least a portion of the peripheral portion 160b has a uniform thickness t2, which is smaller than the thickness t1 of the central portion 160a.

As described above, since the first conductive layer 215c may include substantially the same material as those of the source and drain electrodes 215a and 215b, and may be formed simultaneously with the source and drain electrodes 215a and 215b. In other words, a conductive layer may be formed on the entire surface of the substrate 100 and then patterned to form the source electrode 215a, the drain electrode 215b, and the first conductive layer 215c.

The area where the upper surface of the inorganic insulating layer and the upper surface of the organic material layer 160 meet may define a boundary area. While the conductive layer is patterned, if an inclination of the boundary area is relatively steep (e.g., not gentle), conductive material may not be removed and may remain on the boundary area. In this case, the remaining conductive material may cause an electric short with other conductive layers.

Accordingly, when the organic material layer 160 is formed, the upper surface of the peripheral portion 160b having a gradual or gentle inclination with respect to the upper surface of the inorganic insulating layer may prevent such problems. When the conductive layer is patterned to form the source electrode 215a, the drain electrode 215b, and the first conductive layer 215c, the remaining conductive material on the boundary area may be removed effectively. In other words, the situation where conductive material must be removed but instead remains may be effectively prevented.

The organic material layer 160 may be formed by various methods. For example, a photoresist material may be used to form the organic material layer 160, and during manufacturing processes, an exposure amount may be varied with respect to the central portion 160a and the peripheral portion 160b of the organic material layer 160 (that still has a roughly flat upper surface), by using a slit mask, a half-tone mask, or the like so that a certain portion may be etched (removed) relatively more than other portions. Accordingly, thicknesses of the central portion 160a and the peripheral portion 160b may be different from each other. Also, the organic material layer 160 may be allowed to flow down through a thermal reflow process, and thus, an inclination angle of an edge area of the organic material layer 160 may be adjusted. The method used when manufacturing the display apparatus is not limited to the above example. For example, after forming the organic material layer 160 having a roughly flat upper surface, only a certain portion may be removed by a method such as dry etching, or other various methods may be used. The organic material layer 160 may include, for example, PI, acrylic, BCB, or HMDSO.

The display apparatus according to the present exemplary embodiment may include second conductive layers 213a and 213b, in addition to the first conductive layer 215c. The second conductive layers 213a and 213b may be arranged on the first area 1A or the second area 2A to be located at a different layer level from that of the first conductive layer 215c, and may be electrically connected to the first conductive layer 215c. In FIG. 2, the second conductive layers 213a and 213b are located at the same layer level as the gate electrode 213 of the TFT 210, e.g, on the gate insulating layer 120, and include substantially the same material as that of the gate electrode 213. In addition, the first conductive layer 215c contacts the second conductive layers 213a and 213b via contact holes formed in the interlayer insulating layer 130. In addition, the second conductive layer 213a is located in the first area 1A, and the second conductive layer 213b is located in the second area 2A.

The second conductive layer 213a located in the first area 1A may be electrically connected to the TFT in the display area DA, and thus, the first conductive layer 215c may be electrically connected to the TFT via the second conductive layer 213a. The second conductive layer 213b located in the second area 2A may also be electrically connected to the TFT in the display area DA via the first conductive layer 215c. As described above, the second conductive layers 213a and 213b located outside the display area DA may be electrically connected to components located in the display area DA, or may extend toward the display area DA so as to be located at least partially in the display area DA.

As described above, although FIG. 2 shows the display apparatus that is not bent for convenience of description, the display apparatus is actually in a state in which the substrate 100 is bent at the bending area BA, as shown in FIG. 1. To achieve this, during manufacturing processes, the display apparatus is manufactured in a state in which the substrate 100 is roughly flat, as shown in FIG. 2, and then, the substrate 100 is bent at the bending area BA so that the display apparatus may roughly have the shape as shown in FIG. 1. In this regard, while the substrate 100 is bent at the bending area BA, a tensile stress may be applied to components located in the bending area BA.

Accordingly, the first conductive layer 215c that extends across the bending area BA may include a material having a high elongation rate, and thus, the occurrence of a crack in the first conductive layer 215c or a defect such as a disconnection in the first conductive layer 215c may be prevented. In addition, the second conductive layers 213a and 213b may include a material having a lower elongation rate than that of the first conductive layer 215c and electrical/physical characteristics different from those of the first conductive layer 215c in the first area 1A or the second area 2A. As such, efficiency of transmitting electrical signals in the display apparatus may be improved, or a defect rate during the manufacturing processes may be reduced. For example, the second conductive layers 213a and 213b may include molybdenum, and the first conductive layer 215c may include aluminum. The first conductive layer 215c and the second conductive layers 213a and 213b may have multi-layer structures, if necessary.

Unlike the example shown in FIG. 2, an upper surface of the second conductive layer 213b located in the second area 2A may not be at least partially covered by the planarization layer 140, but may be exposed to the outside, so as to be electrically connected to various electronic devices or printed circuit boards.

A stress neutralization layer (SNL) 600 may be located outside the display area DA. In other words, the SNL 600 may be located over the first conductive layer 215c to correspond to at least the bending area BA.

When a stack structure is bent, there is a stress neutral plane in the stack structure. If there is no SNL 600, when the substrate 100 is bent, an excessive tensile stress may be applied to the first conductive layer 215c in the bending area BA because the location of the first conductive layer 215c may not correspond to the stress neutral plane. However, by forming the SNL 600 and adjusting a thickness and a modulus of the SNL 600, the location of the stress neutral plane in the stack structure, which includes the substrate 100, the first conductive layer 215c, the SNL 600, and the like, may be adjusted. Therefore, the stress neutral plane may be adjusted to be located around the location of the first conductive layer 215c, and thus, a tensile stress which is applied to the first conductive layer 215c may be reduced.

The SNL 600 may extend to an end of the substrate 100 in the display apparatus, unlike the example illustrated in FIG. 2. For example, in the second area 2A, the first conductive layer 215c, the second conductive layer 213b, and/or other conductive layers electrically connected to the first and second conductive layers 215c and 213b may not be covered at least partially by the interlayer insulating layer 130 or the planarization layer 140, but may be electrically connected to various electronic devices or printed circuit boards. Accordingly, the first conductive layer 215c, the second conductive layer 213b, and/or the other conductive layers electrically connected to the first and second conductive layers 215c and 213b may have portions that are electrically connected to the various electronic devices or the printed circuit boards. In this regard, since the electrically connected portions need to be protected from impurities such as external moisture, the SNL 600 may cover the electrically connected portions and thus serve as a protective layer as well. For example, the SNL 600 may extend to the end of the substrate 100 of the display apparatus.

Although, in FIG. 2, an upper surface of the SNL 600 in a direction toward the display area DA (−x direction) coincides with an upper surface of the polarization plate 520 (in the +z direction), the inventive concept is not limited thereto. For example, an end of the SNL 600 in the direction toward the display area DA (−x direction) may partially cover an upper surface at an edge of the polarization plate 520. On the other hand, the end of the SNL 600 in the direction toward the display area DA (−x direction) may not contact the polarization plate 520 and/or a light-transmitting adhesive (e.g., the OCA 510). In the latter case, during or after formation of the SNL 600, degradation of the display device 300 (e.g., an organic light-emitting device), due to gas generated from the SNL 600 moving toward the display area DA (−x direction), may be prevented.

As shown in FIG. 2, when the upper surface of the SNL 600 in the direction toward the display area DA (−x direction) coincides with the upper surface of the polarization plate 520 (in the +z direction), the end of the SNL 600 in the direction toward the display area DA (−x direction) partially covers the upper surface at the edge of the polarization plate 520, or the end of the SNL 600 in the direction toward the display area DA (−x direction) contacts the OCA 510, a portion of the SNL 600 in the direction toward the display area DA (−x direction) may be thicker than other portions of the SNL 600. Since a liquid phase material or a paste-type material may be applied and hardened to form the SNL 600, the volume of the SNL 600 may be reduced during the hardening process. In this regard, when the portion of the SNL 600 in the direction toward the display area DA (−x direction) is in contact with the polarization plate 520 and/or the OCA 510, that portion of the SNL 600 is fixed at that location, and thus, volume reduction occurs in the remaining portion of the SNL 600. As a result, the portion of the SNL 600 in the direction toward the display area DA (−x direction) may be thicker than the other portions of the SNL 600.

FIGS. 3A to 3D are each a cross-sectional view partially showing a display apparatus according to exemplary embodiments of the inventive concept. In detail, FIGS. 3A to 3D are each a cross-sectional view schematically illustrating the bending area BA and neighboring areas.

Figure 3A:
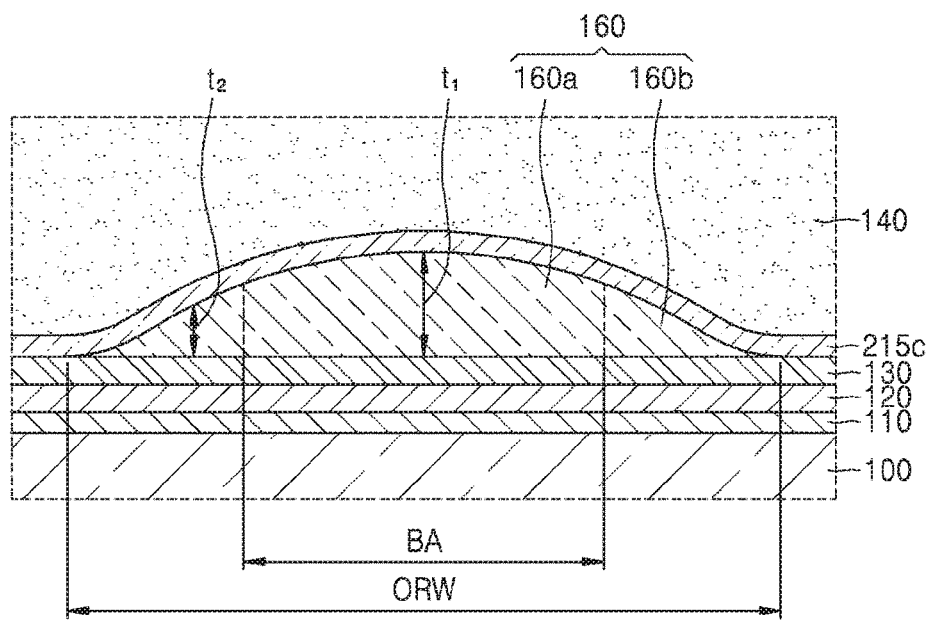
FIG. 3A is a schematic cross-sectional view partially showing a display apparatus according to an exemplary embodiment of the inventive concept.

Referring to FIG. 3A, the predetermined width ORW of the organic material layer 160 is greater than a width of the bending area BA, and the organic material layer 160 has a bank shape having a gentle inclination. The thickness t2 of the peripheral portion 160b of the organic material layer 160 may gradually decrease in a direction away from the central portion 160a. Also, the thickness t1 of the central portion 160a may gradually decrease in a direction from the central area of the central portion 160a toward the peripheral portion 160b. There may be various modifications, such as, for example, the thickness t1 of the central portion 160a may be substantially uniform, and only the thickness t2 of the peripheral portion 160b gradually decreases in the direction away from the central portion 160a. Accordingly, an upper surface of the peripheral portion 160b may have a gentle inclination. According to exemplary embodiments of the inventive concept, an angle between an upper surface of the inorganic insulating layer and the upper surface of the peripheral portion 160b may be less than or equal to 45 degrees.

The organic material layer 160 may be formed by various methods. For example, a photoresist material may be used to form the organic material layer 160, and during manufacturing processes, an exposure amount may be varied with respect to the central portion 160a and the peripheral portion 160b of the organic material layer 160, which still has a roughly flat upper surface, by using a slit mask, a half-tone mask, or the like so that a certain portion may be etched (removed) relatively more than other portions. Accordingly, thicknesses of the central portion 160a and/or the peripheral portion 160b may gradually change. Also, the organic material layer 160 may be allowed to flow down through a thermal reflow process, and thus, an inclination angle of an edge area of the organic material layer 160 may be adjusted.

As described above, the upper surface of the peripheral portion 160b may have a gentle inclination, and thus, when a conductive layer is patterned in order to form the first conductive layer 215c, remaining conductive material may be removed effectively.

Figure 3B:
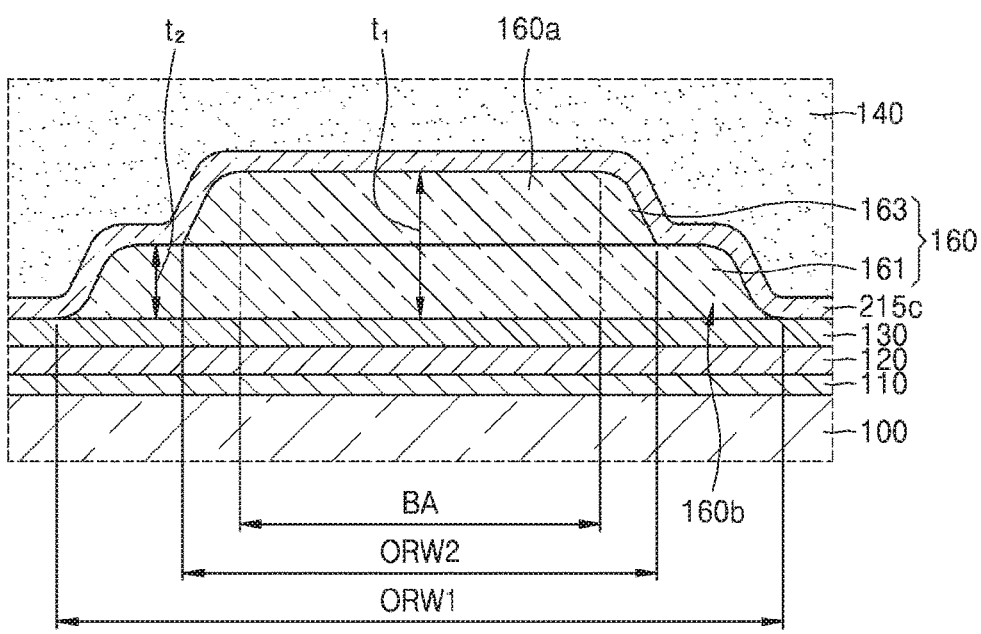
FIG. 3B is a schematic cross-sectional view partially showing a display apparatus according to an exemplary embodiment of the inventive concept.

Referring to FIG. 3B, the organic material layer 160 may have a stacked (or stack) structure including a first organic material layer 161 having a first width ORW1 and a second inorganic material layer 163 having a second width ORW2 smaller than the first width ORW1. In this regard, the second width ORW2 may be greater than a width of the bending area BA. Thus, the central portion 160a may have a substantially uniform thickness t1, and the first organic material layer 161 and the second organic material layer 163 may have a step, and accordingly, an upper surface of the peripheral portion 160b may have a gentle inclination. Although FIG. 3B illustrates an example in which the organic material layer 160 includes two layers, the inventive concept is not limited thereto. Alternatively, the organic material layer 160 may include a plurality of layers having different widths which are stacked on each other so that the upper surface of the peripheral portion 160b may have a gentle inclination. According to exemplary embodiments of the inventive concept, the upper surface of the peripheral portion 160b may have an inclination of about 45 degrees or less with respect to an upper surface of the inorganic insulating layer.

As described above, the upper surface of the peripheral portion 160b may have a gentle inclination, and thus, when a conductive layer is patterned in order to form the first conductive layer 215c, the remaining conductive material may be removed effectively.

Figure 3C:
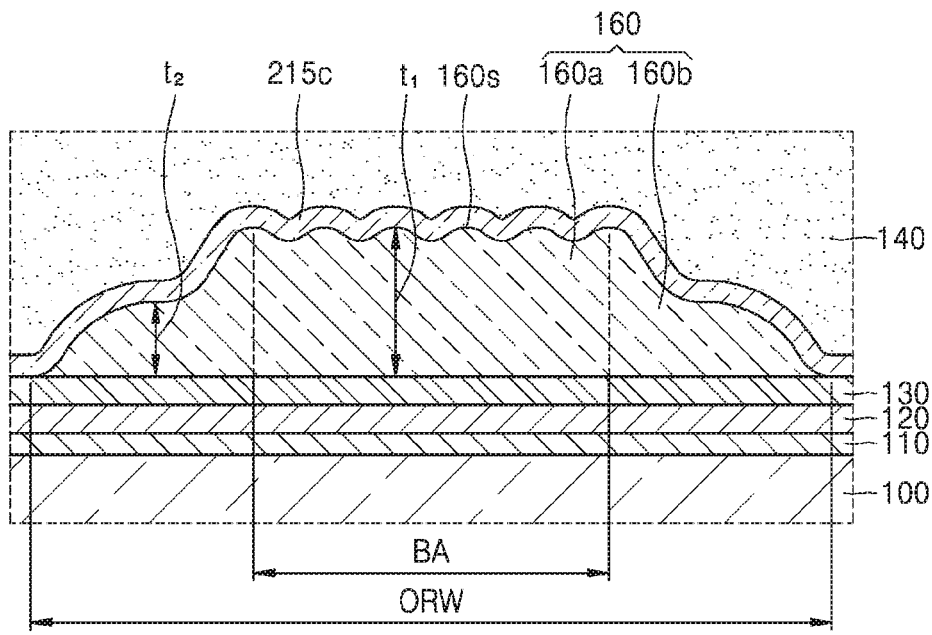
FIG. 3C is a schematic cross-sectional view partially showing a display apparatus according to an exemplary embodiment of the inventive concept.
Figure 3D:
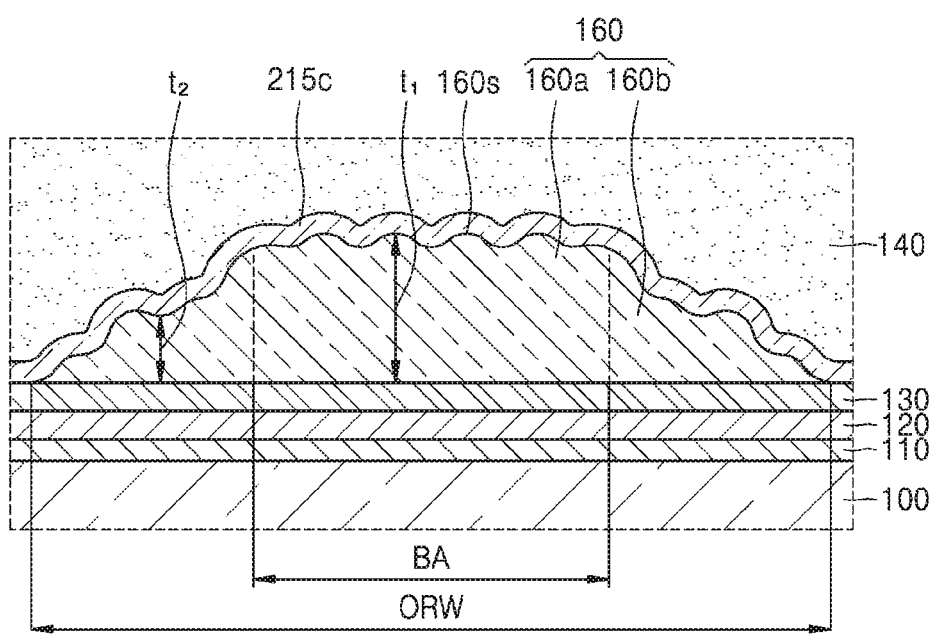
FIG. 3D is a schematic cross-sectional view partially showing a display apparatus according to an exemplary embodiment of the inventive concept.

Referring to FIGS. 3C and 3D, the organic material layer 160 may have an uneven surface 160s at least partially in an upper surface thereof (in the +z direction). FIG. 3C illustrates an example in which the uneven surface 160s is formed only in the central portion 160a of the organic material layer 160. FIG. 3D illustrates an example in which the uneven surface 160s is formed over the entire upper surface of the organic material layer 160. An area where the uneven surface 160s is formed may be variously modified.

Since the organic material layer 160 includes the uneven surface 160s, the first conductive layer 215c located on the organic material layer 160 may have an upper surface and/or a lower surface having a shape corresponding to the uneven surface 160s of the organic material layer 160.

As described above, since tensile stress may be applied to the first conductive layer 215c when the substrate 100 is bent at the bending area BA during the manufacturing processes, when the upper surface and/or the lower surface of the first conductive layer 215c has the shape corresponding to the uneven surface 160s of the organic material layer 160, the amount of tensile stress which is applied to the first conductive layer 215c may be reduced. In other words, the tensile stress that may be generated during the bending process may be reduced via deformation of the shape of the organic material layer 160 having lower hardness. In this regard, the first conductive layer 215c having the uneven shape before the bending process may be transformed to correspond to the shape of the organic material layer 160, which is deformed due to the bending process, and thus, occurrence of a defect, such as a disconnection in the first conductive layer 215c, may be prevented effectively.

Also, the uneven surface 160s may be formed at least partially in the upper surface of the organic material layer 160 (in the +z direction), and thus, a surface area of the upper surface of the organic material layer 160 and a surface area of the upper and lower surfaces of the first conductive layer 215c may be increased. Large surface areas of the upper surface of the organic material layer 160 and the upper and lower surfaces of the first conductive layer 215c may denote that a deformation margin is large enough to reduce the tensile stress caused by the bending of the substrate 100.

Since the first conductive layer 215c is located on the organic material layer 160, the lower surface of the first conductive layer 215c has a shape corresponding to the uneven surface 160s of the organic material layer 160. However, the upper surface of the first conductive layer 215c may have an uneven surface that has a shape independent of the shape of the uneven surface 160s of the organic material layer 160.

For example, after forming a conductive material layer on the organic material layer 160, a photoresist is applied on the conductive material layer and the photoresist is developed while varying an exposure amount, according to locations on the photoresist, by using a slit mask, a half-tone mask, or the like. Accordingly, the conductive material layer exposed due to the developing of the photoresist is etched, the photoresist is removed, and thus, the first conductive layer 215c is formed. Since the exposure amount is varied according to the locations on the photoresist by using the slit mask, the half-tone mask, or the like, the degree of etching of the conductive material layer may vary according to locations on the conductive material layer. Thus, an uneven surface may be artificially formed on the upper surface of the first conductive layer 215c, and in this case, the upper surface of the first conductive layer 215c may have the uneven surface that has a shape independent of the shape of the uneven surface 160s of the organic material layer 160. A similar process may be performed with respect to exemplary embodiments described below. Even when the process of artificially forming the uneven surface on the upper surface of the first conductive layer 215c is performed as described above, the uneven surface on the upper surface of the first conductive layer 215c may still correspond to the uneven surface 160s of the organic material layer 160.

Figure 4:
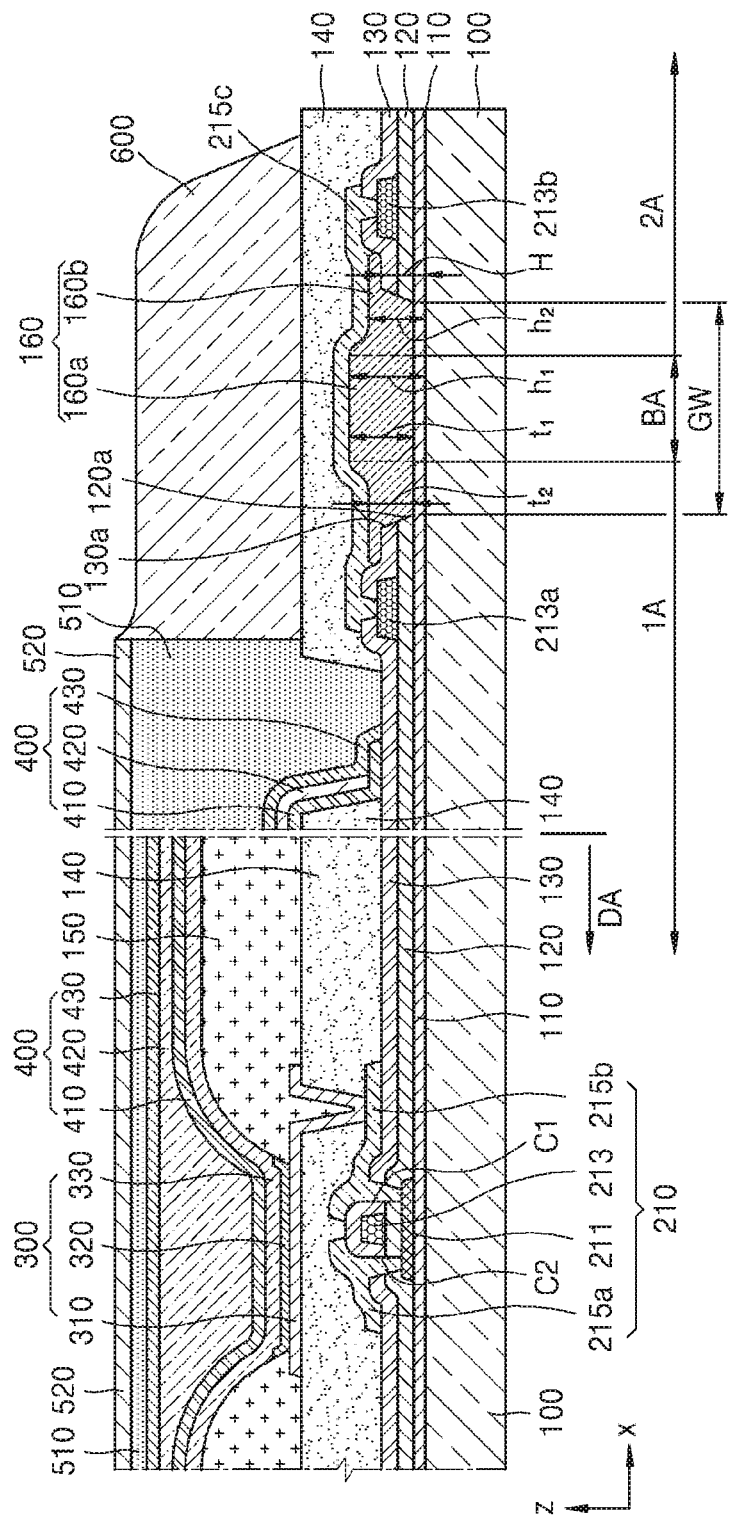
FIG. 4 is a schematic cross-sectional view partially showing a display apparatus according to an exemplary embodiment of the inventive concept.

FIG. 4 is a schematic cross-sectional view partially showing a display apparatus according to an exemplary embodiment of the inventive concept. Although the inorganic insulating layer has been described so far as having a flat upper surface in an area overlapping with an organic insulating layer, the inventive concept is not limited thereto. For example, as illustrated in FIG. 4, the inorganic insulating layer may include a groove at a location corresponding to the bending area BA.

Referring to FIG. 4, the buffer layer 110 may be continuously formed throughout the first area 1A, the bending area BA, and the second area 2A. In addition, the gate insulating layer 120 may have an opening 120a corresponding to the bending area BA, and the interlayer insulating layer 130 may also have an opening 130a corresponding to the bending area BA. Accordingly, the inorganic insulating layer, which includes the buffer layer 110, the gate insulating layer 120, and the interlayer insulating layer 130, may be construed as having a groove corresponding to the bending area BA. Alternatively, the inorganic insulating layer may include a groove of a different type. There may be various modifications, such as, for example, an upper surface of the buffer layer 110 (in the +z direction) may be partially removed, or a lower surface of the gate insulating layer 120 (in −z direction) may not be removed but may remain. Formation of the groove may occur simultaneously with a patterning process for forming the contact holes C1 and C2 for connecting the source electrode 215a and the drain electrode 215b of the TFT 210 to the semiconductor layer 211.

The groove corresponding to the bending area BA may denote that the groove overlaps with the bending area BA. In this regard, an area of the groove may be greater than that of the bending area BA. To achieve this, a width GW of the groove is greater than a width of the bending area BA, as shown in FIG. 4. In this regard, the area of the groove may be defined as an area where the opening (among the openings 120a and 130a) is smallest. In FIG. 4, the area of the groove is defined by the area of the opening 120a in the gate insulating layer 120.

In the display apparatus according to the present exemplary embodiment, the organic material layer 160 is arranged between the inorganic insulating layer and the first conductive layer 215c, and includes the central portion 160a overlapping with the bending area BA and the peripheral portion 160b extending from the central portion 160a. In other words, the peripheral portion 160b refers to an area that does not overlap with the bending area BA. Also, the average thickness <t1> of the central portion 160a of the organic material layer 160 is greater than the average thickness <t2> of the peripheral portion 160b. Since the groove overlaps with the bending area BA, the organic material layer 160 fills the groove. Because the organic material layer 160 fills the groove, although the average thickness <t1> of the central portion 160a is greater than the average thickness <t2> of the peripheral portion 160b, a height h1 of the central portion 160a from an upper surface of the substrate 100 may be less than a height h2 of the peripheral portion 160b from the upper surface of the substrate 100.

Although FIG. 4 shows that the display apparatus is not bent for convenience of description, the display apparatus is actually in a state in which the substrate 100 is bent at the bending area BA, as shown in FIG. 1. To achieve this, during manufacturing processes, the display apparatus is manufactured in a state in which the substrate 100 is roughly flat, as shown in FIG. 4, and then, the substrate 100 is bent at the bending area BA so that the display apparatus may roughly have the shape as shown in FIG. 1. In this regard, tensile stress may be applied to the first conductive layer 215c while the substrate 100 is bent at the bending area BA, but in the display apparatus according to the present exemplary embodiment, the inorganic insulating layer has a groove in the bending area BA, and a portion of the first conductive layer 215c that corresponds to the bending area BA is located on the organic material layer 160 that at least partially fills the groove in the inorganic insulating layer. Accordingly, the occurrence of cracks in the portion of the first conductive layer 215c that corresponds to the bending area BA may be prevented or reduced.

Since the inorganic insulating layer has a higher hardness than the organic material layer 160, the inorganic insulating layer in the bending area BA is more likely to have cracks. When the inorganic insulating layer cracks, there is a high possibility that the cracks may spread to the first conductive layer 215c. Although the organic material layer 160 may block the cracks from spreading, the groove formed in the inorganic insulating layer may further reduce the possibility of the inorganic insulating layer having cracks. Therefore, less tensile stress may be concentrated on the first conductive layer 215c.

As shown in FIG. 4, the organic material layer 160 may cover an inner surface of the groove in the inorganic insulating layer. Various wirings of the display apparatus may be formed by forming a conductive material layer on the entire surface of the substrate 100 and then patterning the conductive material layer. If the organic material layer 160 does not cover an inner surface of the opening 120a of the gate insulating layer 120 or an inner surface of the opening 130a of the interlayer insulating layer 130 (e.g., the groove), during the patterning of the conductive material layer, conductive material may not be removed but may remain on the inner surface of the opening 120a or the opening 130a. In this case, the remaining conductive material may cause an electric short with other conductive layers. Therefore, the organic material layer 160 covering the inner surface of the groove may prevent this.

The height h1 of the central portion 160a of the organic material layer 160 from the upper surface of the substrate 100 may be greater than a height H of the inorganic insulating layer from the upper surface of the substrate 100. In this case, the thickness t2 of the peripheral portion 160b may be adjusted so that an upper surface of the peripheral portion 160b may have a gentle inclination with respect to an upper surface of the inorganic insulating layer. As shown in FIG. 2, the thickness t2 of the peripheral portion 160b decreases in a direction away from the central portion 160a. Also, at least a portion of the peripheral portion 160b may have a uniform thickness t2, which is smaller than the thickness t1 of the central portion 160a. According to exemplary embodiments of the inventive concept, an angle between the upper surface of the peripheral portion 160b and the upper surface of the inorganic insulating layer may be within 45 degrees.

As described above, since the first conductive layer 215c may include substantially the same material as that of the source and drain electrodes 215a and 215b and may be formed simultaneously with the source and drain electrodes 215a and 215b, a conductive layer may be formed on the entire surface of the substrate 100 and then patterned to form the source electrode 215a, the drain electrode 215b, and the first conductive layer 215c. When an inclination of a boundary area, where the upper surface of the inorganic insulating layer and an upper surface of the organic material layer 160 meet, is not gentle, conductive material may not be removed from the boundary area while the conductive layer is patterned and may remain on the boundary area. In this case, the remaining conductive material may cause an electric short with other conductive layers.

Accordingly, when the organic material layer 160 is formed, the upper surface of the peripheral portion 160b may have a gentle inclination with respect to the upper surface of the inorganic insulating layer. Thus, when the conductive layer is patterned in order to form the source electrode 215a, the drain electrode 215b, and the first conductive layer 215c, the remaining conductive material may be removed effectively.

FIGS. 5A to 5D are each a cross-sectional view partially showing a display apparatus according to exemplary embodiments of the inventive concept. In detail, FIGS. 5A to 5D are each a cross-sectional view schematically illustrating the bending area BA and neighboring areas.

Figure 5A:
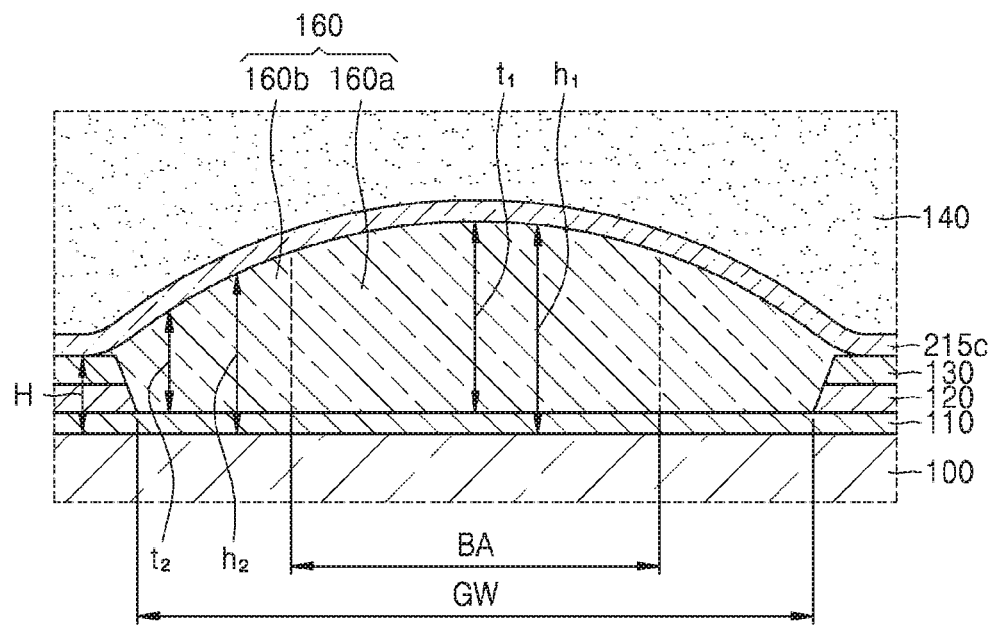
FIG. 5A is a schematic cross-sectional view partially showing a display apparatus according to an exemplary embodiment of the inventive concept.

Referring to FIG. 5A, as the height h1 of the central portion 160a of the organic material layer 160 from an upper surface of the substrate 100 is greater than the height H of the inorganic insulating layer from the upper surface of the substrate 100, the organic material layer 160 is generally higher than an upper surface of the inorganic insulating layer. In other words, the organic material layer 160 has a bank shape having a gentle inclination.

The height h2 of the peripheral portion 160b of the organic material layer 160 from the upper surface of the substrate 100 may gradually decrease in a direction away from the central portion 160a. Also, the height h1 may gradually decrease in a direction from the central area of the center portion 160a to the peripheral portion 160b. There may be various modifications, such as, for example, the thickness t1 of the central portion 160a may be substantially uniform, and only the thickness t2 of the peripheral portion 160b gradually decreases in the direction away from the central portion 160a. Accordingly, an upper surface of the peripheral portion 160b may have a gentle inclination with respect to the upper surface of the inorganic insulating layer. According to exemplary embodiments of the inventive concept, an angle between the upper surface of the inorganic insulating layer and the upper surface of the peripheral portion 160b may be less than or equal to 45 degrees.

The organic material layer 160 may be formed by various methods. For example, a photoresist material may be used to form the organic material layer 160, and during manufacturing processes, an exposure amount may be varied with respect to the central portion 160a and the peripheral portion 160b of the organic material layer 160, which still has a roughly flat upper surface, by using a slit mask, a half-tone mask, or the like, so that a certain portion may be etched (removed) relatively more than other portions. Accordingly, heights of the central portion 160a and/or the peripheral portion 160b may gradually change. Also, the organic material layer 160 may be allowed to flow down through a thermal reflow process, and thus, an inclination angle of an edge area of the organic material layer 160 may be adjusted.

As described above, the upper surface of the peripheral portion 160b may have a gentle inclination with respect to the upper surface of the inorganic insulating layer, and thus, when a conductive layer is patterned in order to form the first conductive layer 215c, the remaining conductive material may be removed effectively.

Figure 5B:
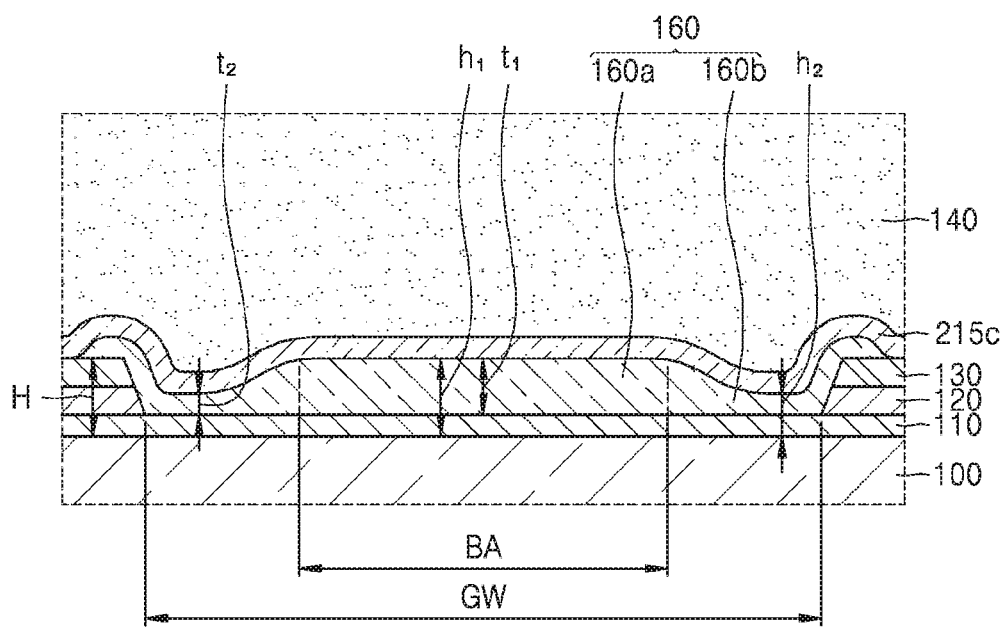
FIG. 5B is a schematic cross-sectional view partially showing a display apparatus according to an exemplary embodiment of the inventive concept.

Referring to FIG. 5B, the height h1 of the central portion 160a of the organic material layer 160 from an upper surface of the substrate 100 may be less than the height H of the inorganic insulating layer from the upper surface of the substrate 100. Also, the peripheral portion 160b may cover an inner surface of a groove and extend to an upper surface of the inorganic insulating layer. Although, in a portion where the peripheral portion 160b covers the inner surface of the groove or a portion where the peripheral portion 160b is on the upper surface of the inorganic insulating layer, the height h2 of the peripheral portion 160b from the upper surface of the substrate 100 may be greater than the height h1, the thickness t2 of the peripheral portion 160b may nevertheless decrease in a direction away from the central portion 160a.

Accordingly, an upper surface of the peripheral portion 160b may have a gentle inclination with respect to the upper surface of the inorganic insulating layer. According to exemplary embodiments of the inventive concept, an angle between the upper surface of the inorganic insulating layer and the upper surface of the peripheral portion 160b may be less than or equal to 45 degrees.

As described above, the upper surface of the peripheral portion 160b may have a gentle inclination with respect to the upper surface of the inorganic insulating layer, and thus, when a conductive layer is patterned to form the first conductive layer 215c, the remaining conductive material may be removed effectively.

Figure 5C:
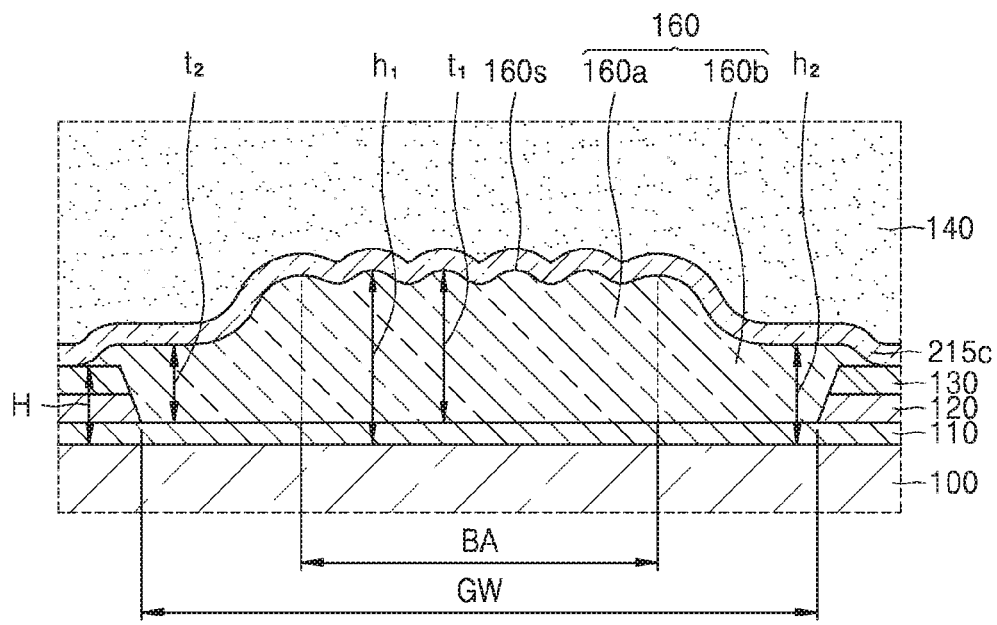
FIG. 5C is a schematic cross-sectional view partially showing a display apparatus according to an exemplary embodiment of the inventive concept.
Figure 5D:
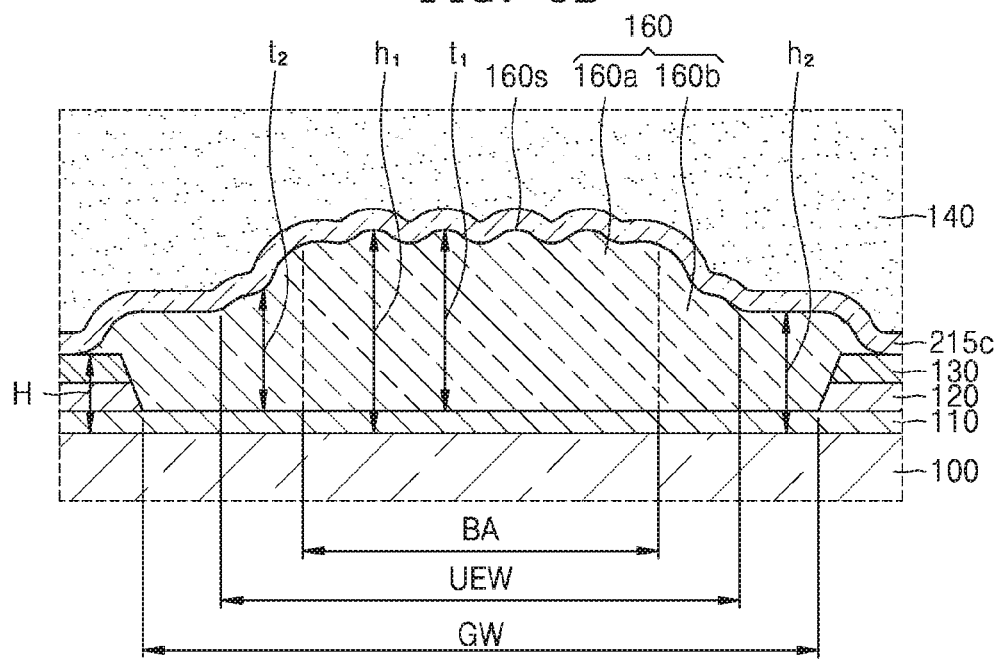
FIG. 5D is a schematic cross-sectional view partially showing a display apparatus according to an exemplary embodiment of the inventive concept.

Referring to FIGS. 5C and 5D, the organic material layer 160 may have the uneven surface 160s at least partially in an upper surface thereof (in the +z direction). FIG. 5C illustrates an example in which the uneven surface 160s is formed only in the central portion 160a of the organic material layer 160. FIG. 5D illustrates an example in which the uneven surface 160s is formed mainly in the central portion 160a so that an area of the uneven surface 160s may be greater than an area of the central portion 160a. In FIG. 5D, a width UEW of the uneven surface 160s is greater than a width of the bending area BA. The area where the uneven surface 160s is formed may be variously modified. For example, the uneven surface 160s may be formed over the entire upper surface of the organic material layer 160.

Since the organic material layer 160 includes the uneven surface 160s, the first conductive layer 215c located on the organic material layer 160 may have an upper surface and/or a lower surface having a shape corresponding to the uneven surface 160s of the organic material layer 160.

As described above, since tensile stress may be applied to the first conductive layer 215c when the substrate 100 is bent at the bending area BA during the manufacturing processes, when the upper surface and/or the lower surface of the first conductive layer 215c has the shape corresponding to the uneven surface 160s, the amount of tensile stress applied to the first conductive layer 215c may be reduced. In other words, the tensile stress that may be generated during the bending process may be reduced via deformation of the shape of the organic material layer 160 having a lower hardness. In this regard, the first conductive layer 215c having the uneven shape before the bending process may be transformed to correspond to the shape of the organic material layer 160, which is deformed due to the bending process, and thus, the occurrence of a defect, such as a disconnection in the first conductive layer 215c, may be effectively prevented.

Also, the uneven surface 160s is formed at least partially in the upper surface of the organic material layer 160 (in the +z direction), and thus, a surface area of the upper surface of the organic material layer 160 and a surface area of the upper and lower surfaces of the first conductive layer 215c may be increased. Large surface areas of the upper surface of the organic material layer 160 and the upper and lower surfaces of the first conductive layer 215c may denote that a deformation margin is large enough to reduce the tensile stress caused by bending of the substrate 100.

Since the first conductive layer 215c is located on the organic material layer 160, the lower surface of the first conductive layer 215c has a shape corresponding to the uneven surface 160s of the organic material layer 160. However, the upper surface of the first conductive layer 215c may have an uneven surface that has a shape independent of the shape of the uneven surface 160s.

Figure 5E:
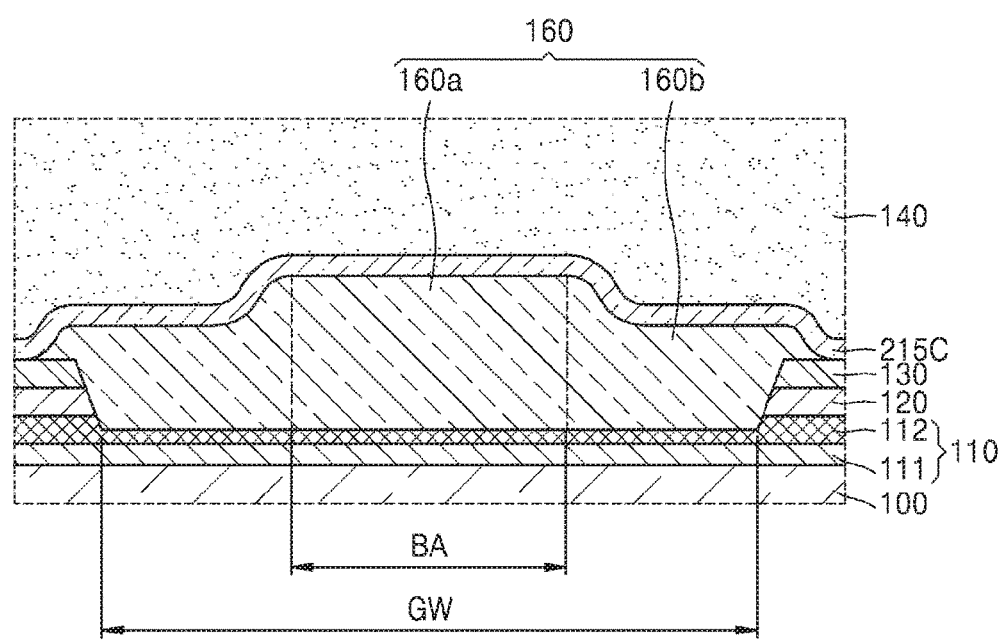
FIG. 5E is a schematic cross-sectional view partially showing a display apparatus according to an exemplary embodiment of the inventive concept.

Referring to FIG. 5E, the buffer layer 110 may include a stack structure including a first buffer layer 111 and a second buffer layer 112. Also, the first buffer layer 111 may continuously extend over the first area 1A, the bending area BA, and the second area 2A. An upper surface of the second buffer layer 112 (in the +z direction) may be partially removed from the bending area BA. In addition, the gate insulating layer 120 may have the opening 120a corresponding to the bending area BA, and the interlayer insulating layer 130 may also have the opening 130a corresponding to the bending area BA. Accordingly, the inorganic insulating layer, including the buffer layer 110, the gate insulating layer 120, and the interlayer insulating layer 130, may be construed as having a groove corresponding to the bending area BA.

The above-described structure may allow a portion of the second buffer layer 112 to also be etched in an etching process during which the openings 120a and 130a are formed in the gate insulating layer 120 and the interlayer insulating layer 130, respectively.

According to exemplary embodiments of the inventive concept, the inorganic insulating layer may include a groove of a different type. There may be various modifications, for example, a lower surface of the gate insulating layer 120 (in the −z direction) may not be removed, but may remain. Formation of the groove may occur simultaneously with a patterning process for forming the contact holes C1 and C2 for connecting the source electrode 215a and the drain electrode 215b of the TFT 210 to the semiconductor layer 211.

With respect to the exemplary embodiments described below, for convenience of description, the inorganic insulating layer has a flat upper surface in an area overlapping with the organic material layer 160. However, the exemplary embodiments may instead have the inorganic insulating layer with a groove, as described above.

Figure 6:
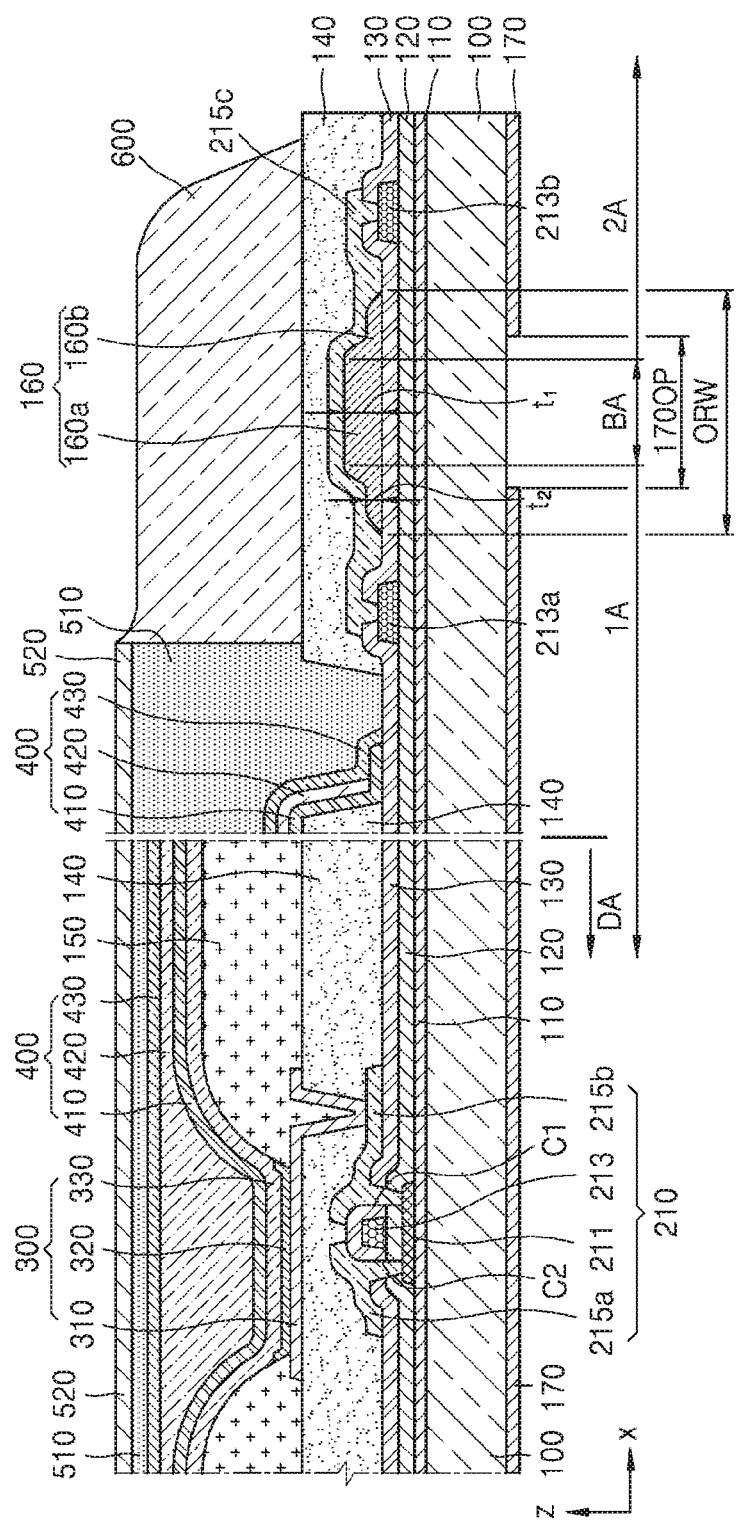
FIG. 6 is a schematic cross-sectional view partially showing a display apparatus according to an exemplary embodiment of the inventive concept.

FIG. 6 is a schematic cross-sectional view partially showing a display apparatus according to an exemplary embodiment of the inventive concept. Referring to FIG. 6, the display apparatus may further include a protective film 170 for protecting the substrate 100. The protective film 170 is a lower protective film for protecting a lower surface of the substrate 100, and as shown in FIG. 6, the protective film 170 may include an opening 170OP. The opening 170OP corresponds to the bending area BA, and an area of the opening 170OP may be greater than an area of the bending area BA. In FIG. 6, a width of the opening 170OP is greater than a width of the bending area BA.

Since the protective film 170 protects the lower surface of the substrate 100, the protective film 170 may have its own strength. Accordingly, when the protective film 170 has a low level of flexibility, the protective film 170 may be isolated or separated from the substrate 100 when the substrate 100 is bent. Therefore, as shown in FIG. 6, when the protective film 170 includes the opening 170OP corresponding to the bending area BA, the occurrence of such isolation between the protective film 170 and the substrate 100 may be effectively prevented. Consequently, as described above, the area of the opening 170OP in the protective film 170 is greater than the area of the bending area BA to prevent the isolation.

However, considering that the protective film 170 has to protect the lower surface of the substrate 100 as much as possible, the area of the opening 170OP in the protective film 170 may need to be reduced. Therefore, the area of the opening 170OP in the protective film 170 may be greater than the area of the bending area BA, but may be smaller than an area of the organic material layer 160. Thus, in FIG. 6, the width of the opening 170OP is greater than the width of the bending area BA, but is smaller than the predetermined width ORW of the organic material layer 160. The protective film 170 having the above-described shape may be applied to the display apparatuses of the exemplary embodiments described above and below.

If necessary, unlike the protective film 170 shown in FIG. 6, the protective film 170 may not cover an edge of the substrate 100. In other words, the protective film 170 may not be in the second area 2A.

In the exemplary embodiments described above, the first conductive layer 215c is formed of substantially the same material as that of the source or drain electrode 215a or 215b of the TFT 210 at substantially the same time. However, the inventive concept is not limited thereto.

Figure 7:
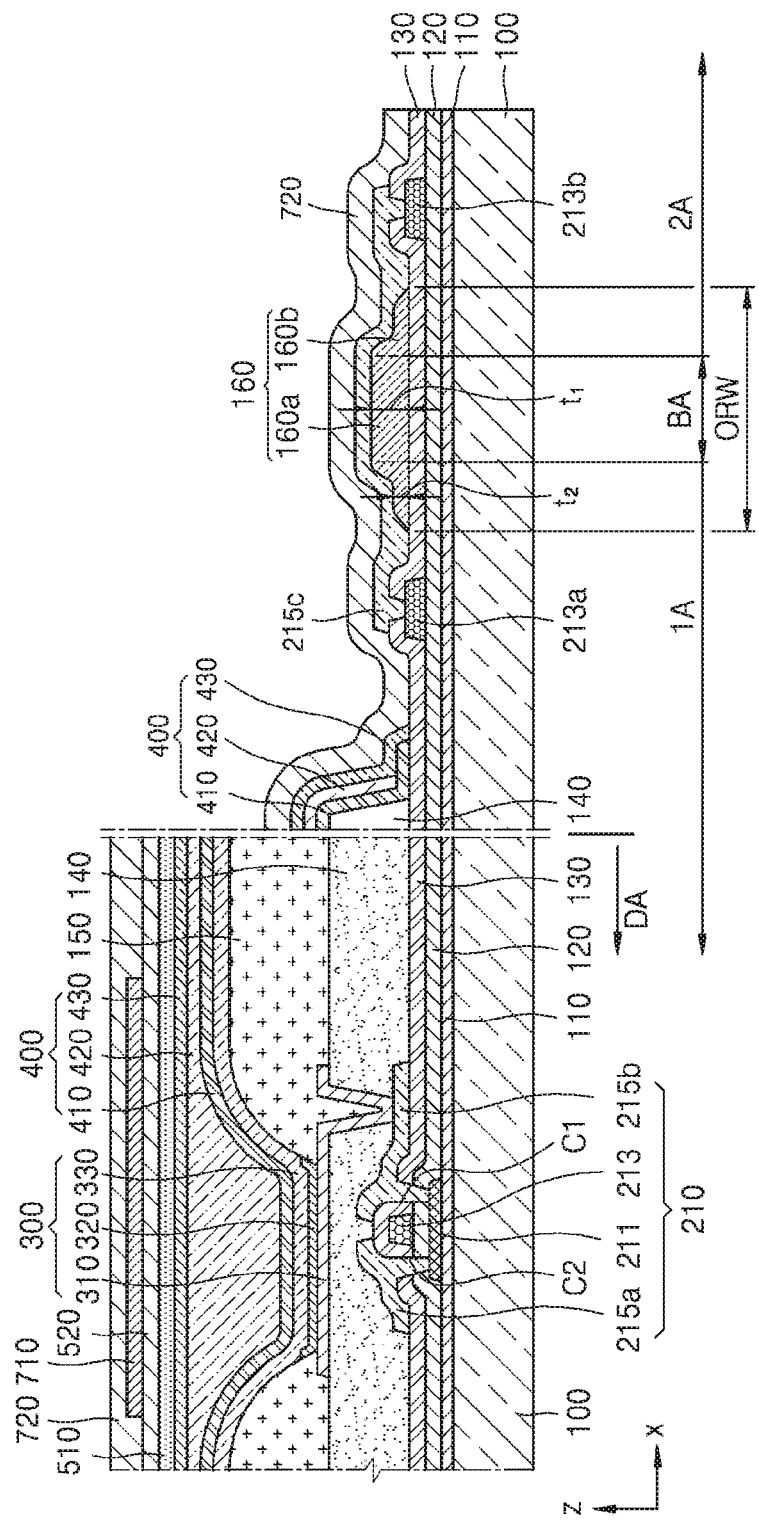
FIG. 7 is a schematic cross-sectional view partially showing a display apparatus according to an exemplary embodiment of the inventive concept.

For example, as shown in FIG. 7, which is a schematic cross-sectional view partially showing a display apparatus according to an exemplary embodiment of the inventive concept, a touch electrode 710 having various patterns may be located above the encapsulation layer 400 for implementing a touchscreen function. When the touch electrode 710 is formed, the first conductive layer 215c may be simultaneously formed by using substantially the same material as that of the touch electrode 710. Also, when a touch protective layer 720 for protecting the touch electrode 710 is formed, a protective layer covering the first conductive layer 215c may be simultaneously formed. If necessary, the touch protective layer 720 may integrally extend from the display area DA to at least the bending area BA, as shown in FIG. 7. The formation of the first conductive layer 215c simultaneously with the touch electrode 710 may be applied to the display apparatuses of the exemplary embodiments described above or below. Unlike the above example, the first conductive layer 215c may instead be formed simultaneously with the opposite electrode 330 by using substantially the same material as that of the opposite electrode 330.

In this case, when an organic material layer which is included in the display area DA is formed, the organic material layer 160 may be formed using substantially the same material as that of the organic material layer in the display area DA. For example, when the planarization layer 140 is formed using an organic material, the organic material layer 160 may be formed simultaneously with the planarization layer 140 by using substantially the same material as that of the planarization layer 140. As another example, the organic material layer 160 may be formed simultaneously with the pixel defining layer 150 by using substantially the same material as that of the pixel defining layer 150. As another example, the organic material layer 160 may be formed simultaneously with the organic encapsulation layer 420 of the encapsulation layer 400 by using substantially the same material as that of the organic encapsulation layer 420 of the encapsulation layer 400.

In addition, there may be various modifications, for example, when the interlayer insulating layer 130 is formed using an insulating organic material, the organic material layer 160 may be formed simultaneously with the interlayer insulating layer 130 by using substantially the same material as that of the interlayer insulating layer 130. If necessary, the organic material layer 160 may be formed by a separate process regardless of the planarization layer 140.

The formation of the organic material layer 160 simultaneously with the organic material layer which is included in the display area DA by using substantially the same material as that of the organic material layer may be similarly applied to the display apparatuses of exemplary embodiments described above or below.

In this regard, the first conductive layer 215c may be formed simultaneously with the touch electrode 710 by using substantially the same material as that of the touch electrode 710, as described above. In this case, the touch protective layer 720 may cover the first conductive layer 215c. Alternatively, in addition to the touch protective layer 720, another organic insulating layer may be needed for the touchscreen function. For example, another additional touch electrode may be present in addition to the touch electrode 710, and an organic insulating layer may be between the touch electrode 710 and the other additional touch electrode. In this case, the organic insulating layer may extend and cover the first conductive layer 215c, or a layer which is formed simultaneously with the organic insulating layer by using substantially the same material as that of the organic insulating layer may cover the first conductive layer 215c.

There may be various modifications, for example, the first conductive layer 215c may be formed simultaneously with the source electrode 215a or the drain electrode 215b by using substantially the same material as that of the source electrode 215a or the drain electrode 215b, rather than the touch electrode 710. In this case, the first conductive layer 215c may be covered by the planarization layer 140 or another insulating layer.

Figure 8:
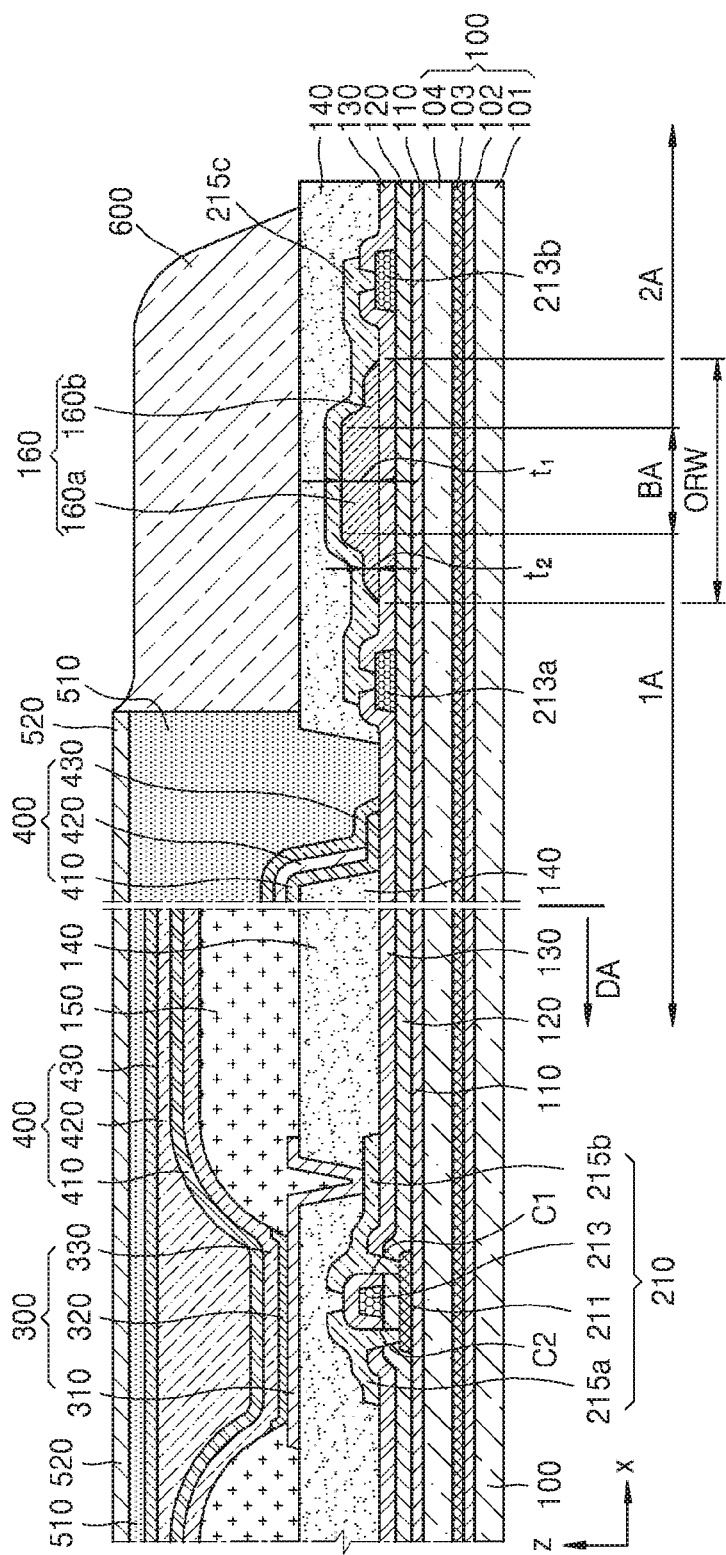
FIG. 8 is a schematic cross-sectional view partially showing a display apparatus according to an exemplary embodiment of the inventive concept.

FIG. 8 is a schematic cross-sectional view partially showing a display apparatus according to an exemplary embodiment of the inventive concept. Referring to FIG. 8, the substrate 100 of the display apparatus may have a multi-layer structure. The substrate 100 may include a stack structure including a first resin layer 101, a barrier layer 102, an intermediate layer 103, and a second resin layer 104.

The first resin layer 101 and the second resin layer 104 may each include a polymer resin such as PES, polyacrylate, PEI, PEN, PET, PPS, PAR, PI, PC, or CAP.

The barrier layer 102 may be disposed between the first resin layer 101 and the second resin layer 104 to prevent penetration of moisture or oxygen. The barrier layer 102 may include an inorganic material such as metal oxide, silicon nitride, or silicon oxide. The barrier layer 102 may include a single-layer film or may include multi-layer films stacked on each other.

The intermediate layer 103 may be disposed between the barrier layer 102 and the second resin layer 104 to strengthen adhesion between the barrier layer 102 and the second resin layer 104. The intermediate layer 103 may include an amorphous material such as amorphous silicon, indium tin oxide (ITO), Al, Ti and/or Mo. However, the material of the intermediate layer 103 is not limited thereto, and any material that may strengthen adhesion between the barrier layer 102 and the second resin layer 104 may be used to form the intermediate layer 103. In addition, if necessary, the substrate 100 may include additional resin layers, barrier layers, and intermediate layers.

Figure 9A:
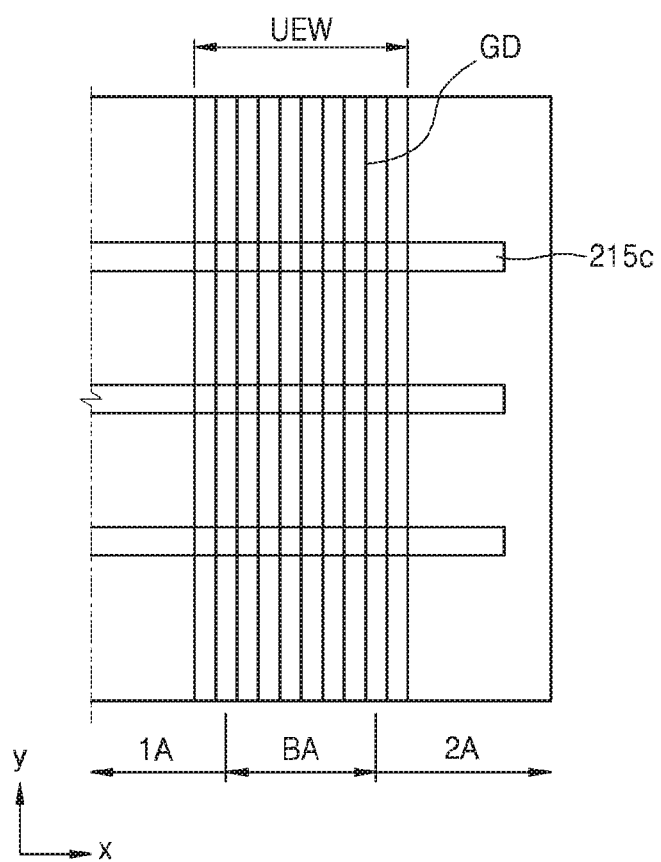
FIG. 9A is a schematic plan view partially showing a display apparatus according to an exemplary embodiment of the inventive concept.
Figure 9B:
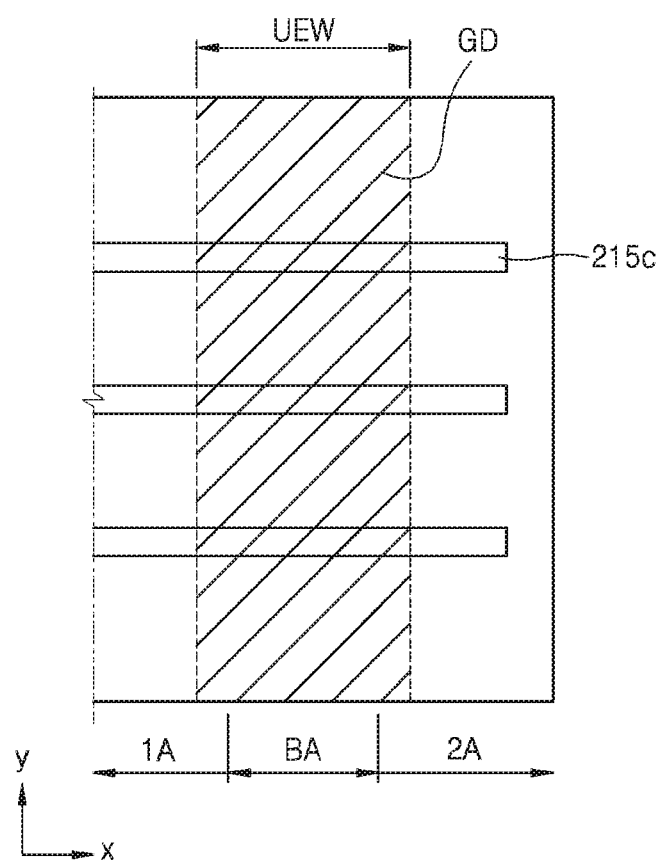
FIG. 9B is a schematic plan view partially showing a display apparatus according to an exemplary embodiment of the inventive concept.

As described above, when the substrate 100 has a multi-layer structure, a penetration path of moisture or oxygen may be more efficiently blocked compared to when the substrate 100 has a single-layer structure, and thus, the occurrence of defects in the display device 300 may be prevented or reduced. Also, the substrate 100 according to the present exemplary embodiment may employ the intermediate layer 103 to prevent exfoliation between the barrier layer 102 and the second resin layer 104. In the exemplary embodiments that have been described above, the first conductive layer 215c may extend in the second direction (+x direction) and cross the first direction (+y direction) in which a protrusion of the uneven surface 160s of the upper surface of the organic material layer 160 extends. The cross angle may be 90 degrees as shown in FIG. 9A, which is a conceptual plan view partially showing a display apparatus according to an exemplary embodiment of the inventive concept, or may not be 90 degrees as shown in FIG. 9B. Reference numeral GD of FIGS. 9A and 9B denotes a direction in which the uneven surface 160s of the upper surface of the organic material layer 160 extends. Although the direction in which the uneven surface 160s extends is shown in FIG. 9B to be inclined with respect to the second direction (+x direction), as opposed to FIG. 9A, the inventive concept is not limited thereto. For example, the direction in which the uneven surface 160s extends may be the first direction (+y direction), and an extension direction of the first conductive layer 215c may not be the second direction (+x direction) but a direction inclined with respect to the second direction (+x direction) (for example, a direction having an angle of 45 degrees with respect to the second direction (+x direction)). When a plurality of first conductive layers 215c is present, an angle of some of the plurality of first conductive layers 215c with respect to the second direction (+x direction) may be different from an angle of the remaining of the plurality of first conductive layers 215c with respect to the second direction (+x direction).

Figure 9C:
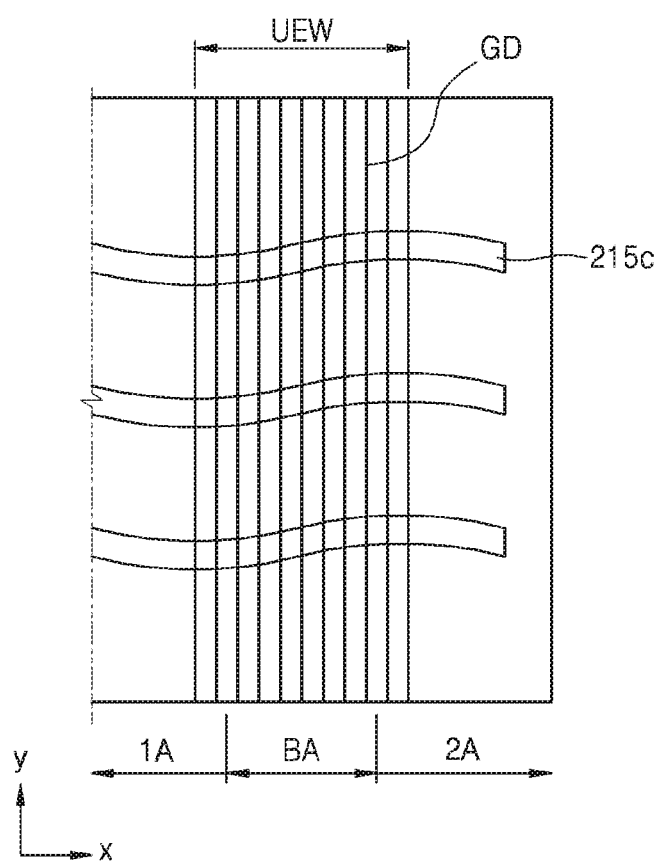
FIG. 9C is a schematic plan view partially showing a display apparatus according to an exemplary embodiment of the inventive concept.

In addition, although, in FIGS. 9A and 9B, the first conductive layer 215c extends straight in the second direction (+x direction), the inventive concept is not limited thereto. There may be various modifications, for example, as shown in FIG. 9C, the first conductive layer 215c may zigzag left and right or may be wavy on a plane where the first direction (+y direction) and the second direction (+x direction) cross each other (an xy plane).

According to the exemplary embodiments of the inventive concept described above, a longer lifespan of a display apparatus may be guaranteed, and the occurrence of defects, such as disconnection, may be reduced when manufacturing the display apparatus.

While the inventive concept has been shown and described with reference to exemplary embodiments thereof, it will be understood by those of ordinary skill in the art that various changes in form and details may be made thereto without departing from the spirit and scope of the present inventive concept as defined by the following claims.

What is claimed is:

1. A display apparatus comprising:
a substrate comprising a first area, a second area, and a bending area located between the first area and the second area, the bending area configured to be bent about a first bending axis extending in a first direction;
an inorganic insulating layer arranged over the substrate;
a first conductive layer extending from the first area to the second area passing over the bending area, and arranged over the inorganic insulating layer; and
an organic material layer arranged between the inorganic insulating layer and the first conductive layer, directly contacting the inorganic insulating layer, and comprising a central portion and a peripheral portion,
wherein the central portion overlaps with the bending area,
the peripheral portion extends from the central portion, and
an average thickness of the central portion is greater than an average thickness of the peripheral portion.

2. The display apparatus of claim 1, wherein the inorganic insulating layer has a flat upper surface at an area overlapping with the organic material layer.

3. The display apparatus of claim 1, wherein the central portion has a substantially uniform thickness.

4. The display apparatus of claim 1, wherein the peripheral portion comprises an area having a substantially uniform thickness, and a thickness of the peripheral portion decreases in a direction away from the central portion.

5. The display apparatus of claim 1, wherein a thickness of the peripheral portion gradually decreases in a direction away from the central portion.

6. The display apparatus of claim 1, wherein the organic material layer comprises:
a first organic material layer; and
a second organic material layer arranged on the first organic material layer,
wherein the first organic material layer has a first width, the second organic material layer has a second width smaller than the first width,
the second width is greater than a width of the bending area.

7. The display apparatus of claim 1, wherein the organic material layer has an uneven surface at least partially in an upper surface of the organic material layer.

8. The display apparatus of claim 7, wherein the organic material layer has the uneven surface in the central portion.

9. The display apparatus of claim 7, wherein an upper surface of the first conductive layer over the organic material layer has a shape corresponding to a shape of the upper surface of the organic material layer.

10. The display apparatus of claim 1, wherein the inorganic insulating layer has a groove in an area overlapping with the organic material layer.

11. The display apparatus of claim 10, wherein an area of the groove is larger than an area of the bending area.

12. The display apparatus of claim 10, wherein the organic material layer covers an inner surface of the groove.

13. The display apparatus of claim 10, wherein a height of the organic material layer from an upper surface of the substrate is greater than a height of the inorganic insulating layer from the upper surface of the substrate.

14. The display apparatus of claim 10, wherein a height of the peripheral portion from an upper surface of the substrate gradually decreases in a direction away from the central portion.

15. The display apparatus of claim 10, wherein a height of the organic material layer from an upper surface of the substrate is less than a height of the inorganic insulating layer from the upper surface of the substrate.

16. The display apparatus of claim 10, wherein the organic material layer has an uneven surface at least partially in an upper surface of the organic material layer.

17. The display apparatus of claim 16, wherein the organic material layer has the uneven surface in the central portion.

18. The display apparatus of claim 16, wherein an area of the uneven surface is larger than an area of the central portion.

19. The display apparatus of claim 10, wherein an upper surface of the first conductive layer over the organic material layer has a shape corresponding to a shape of the upper surface of the organic material layer.

20. The display apparatus of claim 1, further comprising:
a protective film disposed on a lower surface of the substrate,
wherein the lower surface is opposite a surface of the substrate nearest to the inorganic insulating layer, and
the protective film comprises an opening corresponding to the bending area.

21. The display apparatus of claim 20, wherein an area of the opening is larger than an area of the bending area.

22. The display apparatus of claim 1, further comprising:
an encapsulation layer covering a display device over the first area; and
a touch electrode configured to provide a touchscreen and located over the encapsulation layer,
wherein the first conductive layer comprises substantially the same material as that of the touch electrode.

23. The display apparatus of claim 22, further comprising a touch protective layer covering the touch electrode and the first conductive layer.

24. The display apparatus of claim 1, further comprising:
a thin film transistor (TFT) arranged over the first area or the second area and comprising a source electrode, a drain electrode, and a gate electrode; and
a planarization layer covering the TFT and comprising an organic material,
wherein the organic material layer comprises substantially the same material as that of the planarization layer.

25. The display apparatus of claim 1, further comprising:
an organic light-emitting device arranged over the first area and comprising a pixel electrode, an opposite electrode facing the pixel electrode, and an intermediate layer comprising an organic emission layer and arranged between the pixel electrode and the opposite electrode; and
a pixel defining layer arranged over the first area, the pixel defining layer having an opening that exposes a center portion of the pixel electrode and defines a pixel area,
wherein the organic material layer comprises substantially the same material as that of the pixel defining layer.

26. The display apparatus of claim 1, further comprising an encapsulation layer comprising a first inorganic encapsulation layer, a second inorganic encapsulation layer, and an organic encapsulation layer between the first inorganic encapsulation layer and the second inorganic encapsulation layer and covering a display device over the first area,
wherein the organic material layer comprises substantially the same material as that of the organic encapsulation layer.

27. The display apparatus of claim 1, further comprising a second conductive layer arranged over the first area or the second area,
wherein the second conductive layer is located on a layer different from a layer on which the first conductive layer is located, and
the second conductive layer is electrically connected to the first conductive layer.

28. The display apparatus of claim 27, wherein an elongation rate of the first conductive layer is greater than that of the second conductive layer.

29. The display apparatus of claim 27, further comprising a TFT arranged over the first area or the second area and comprising a source electrode, a drain electrode, and a gate electrode,
wherein the first conductive layer is on a same layer as the source electrode and the drain electrode, and
the second conductive layer is on a same layer as the gate electrode.

30. The display apparatus of claim 1, further comprising a stress neutralization layer arranged over an upper portion of the first conductive layer.

31. A display apparatus comprising:
a substrate divided into a first area, a second area, and a bending area located between the first area and the second area, the bending area configured to be bent about a first bending axis extending in a first direction;
an inorganic insulating layer arranged over the substrate;
a first conductive layer extending from the first area to the second area passing over the bending area, and arranged over the inorganic insulating layer; and an organic material layer arranged between the inorganic insulating layer and the first conductive layer, and comprising a central portion and a peripheral portion, wherein the central portion overlaps with the bending area, the peripheral portion extends from the central portion, an average thickness of the central portion is greater than an average thickness of the peripheral portion, the substrate has a multi-layer structure extending through the first area, the second area, and the bending area, the substrate comprising:
- a first resin layer comprising a polymer resin;
- a barrier layer comprising an inorganic material and disposed over the first resin layer;
- an intermediate layer comprising an amorphous material and disposed over the barrier layer; and
- a second resin layer comprising a polymer resin and disposed over the intermediate layer, and wherein an upper surface of the inorganic insulating layer and an upper surface of the peripheral portion of the organic material layer contact, forming an angle that is less than or equal to 45 degrees.

32. The display apparatus of claim 31, wherein the first conductive layer extends from the first area to the second area in a second direction perpendicular to the first direction, and the first conductive layer forms a wavy pattern while extending in the second direction.

33. The display apparatus of claim 31, further comprising:

a protective film disposed on a lower surface of the substrate, wherein the lower surface is opposite a surface of the substrate nearest to the inorganic insulating layer, the protective film comprises an opening corresponding to the bending area, and an area of the opening is larger than an area of the bending area and smaller than an area of the organic material layer.

34. A display apparatus comprising:

a substrate comprising a first area, a second area, and a bending area located between the first area and the second area, the bending area configured to be bent about a first bending axis extending in a first direction;

an inorganic insulating layer arranged over the substrate;

a first conductive layer extending from the first area to the second area passing over the bending area, and arranged over the inorganic insulating layer; and an organic material layer arranged between the inorganic insulating layer and the first conductive layer, and comprising a central portion and a peripheral portion, wherein the central portion overlaps with the bending area, the peripheral portion extends from the central portion, an average thickness of the central portion is greater than an average thickness of the peripheral portion, the organic material layer comprises a first organic material layer and a second organic material layer arranged on the first organic material layer, the first organic material layer has a first width, the second organic material layer has a second width smaller than the first width, the second width is greater than a width of the bending area, the first organic material layer and the second organic material layer overlap in an overlapping portion, and the first organic material layer and the second organic material layer form a step in a step portion outside the overlapping portion, and an upper surface of the first organic material layer in the step portion is substantially parallel to an upper surface of the inorganic insulating layer.

* * * * *